United States Patent
Ishikawa

(10) Patent No.: US 7,015,080 B2
(45) Date of Patent: Mar. 21, 2006

(54) MANUFACTURING METHOD OF SEMICONDUCTOR DEVICE

(75) Inventor: Akira Ishikawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/670,310

(22) Filed: Sep. 26, 2003

(65) Prior Publication Data

US 2004/0063256 A1    Apr. 1, 2004

(30) Foreign Application Priority Data

Sep. 27, 2002  (JP) ............................. 2002-284029

(51) Int. Cl.
*H01L 21/00* (2006.01)
*H01L 21/3205* (2006.01)

(52) U.S. Cl. .................. 438/151; 438/163; 438/304; 438/596

(58) Field of Classification Search ................ 438/304, 438/367, 596, 151, 163
See application file for complete search history.

(56) References Cited

U.S. PATENT DOCUMENTS

| | | | |
|---|---|---|---|
| 5,049,514 A * | 9/1991 | Mori | 438/301 |
| 5,079,617 A * | 1/1992 | Yoneda | 257/755 |
| 5,276,347 A | 1/1994 | Wei et al. | |
| 5,413,961 A * | 5/1995 | Kim | 438/639 |
| 5,432,108 A * | 7/1995 | Lee | 438/157 |
| 5,445,987 A * | 8/1995 | Kuroda et al. | 438/257 |
| 5,459,090 A | 10/1995 | Yamazaki et al. | |
| 5,473,184 A * | 12/1995 | Murai | 257/382 |
| 5,687,113 A * | 11/1997 | Papadas et al. | 365/185.01 |
| 5,767,006 A * | 6/1998 | Lee | 438/597 |
| 6,180,502 B1 * | 1/2001 | Liang | 438/595 |
| 6,274,887 B1 | 8/2001 | Yamazaki et al. | |
| 6,297,093 B1 * | 10/2001 | Borel et al. | 438/257 |
| 6,335,231 B1 | 1/2002 | Yamazaki et al. | |
| 6,392,628 B1 | 5/2002 | Yamazaki et al. | |
| 6,424,011 B1 * | 7/2002 | Assaderaghi et al. | 257/350 |
| 6,495,406 B1 * | 12/2002 | Honeycutt | 438/197 |
| 6,528,854 B1 | 3/2003 | Yoshida et al. | |
| 6,559,036 B1 | 5/2003 | Ohtani et al. | |
| 6,613,666 B1 * | 9/2003 | Ma | 438/637 |

(Continued)

FOREIGN PATENT DOCUMENTS

JP          63274181 A  * 11/1988

OTHER PUBLICATIONS

U.S. Appl. No. 10/668,969, filed Sep. 24, 2003, Inventor Akira ishikawa, (English Specification with Drawings and Claims).

(Continued)

*Primary Examiner*—Matthew Smith
*Assistant Examiner*—Lex H. Malsawma
(74) *Attorney, Agent, or Firm*—Nixon Peabody LLP; Jeffrey L. Costellia

(57) ABSTRACT

The present invention makes it is possible to provide a manufacturing method of a semiconductor device by which damage by plasma process or doping process during a LDD formation process can be reduced as much as possible. Charge density to be stored in a gate electrode and the damage of an element due to plasma are reduced as much as possible during anisotropic etching of an LDD formation process, by forming an LDD region in the state that a conductive protecting film is formed to cover a whole area of a substrate. Further, damage by charged particles during a process of doping a high concentration of impurity is also reduced.

27 Claims, 15 Drawing Sheets

U.S. PATENT DOCUMENTS

| | | |
|---|---|---|
| 2001/0030322 A1 | 10/2001 | Yamazaki et al. |
| 2001/0035526 A1 | 11/2001 | Yamazaki et al. |
| 2001/0041392 A1 | 11/2001 | Suzawa et al. |
| 2001/0052950 A1 | 12/2001 | Yamazaki et al. |
| 2001/0055841 A1 | 12/2001 | Yamazaki et al. |
| 2002/0000551 A1 | 1/2002 | Yamazaki et al. |
| 2002/0006705 A1 | 1/2002 | Suzawa et al. |
| 2002/0008797 A1 | 1/2002 | Yamazaki et al. |
| 2002/0016028 A1 | 2/2002 | Arao et al. |
| 2002/0024051 A1 | 2/2002 | Yamazaki et al. |
| 2002/0028544 A1 | 3/2002 | Fujimoto et al. |
| 2002/0070382 A1 | 6/2002 | Yamazaki et al. |
| 2002/0102783 A1 | 8/2002 | Fujimoto et al. |
| 2002/0110941 A1 | 8/2002 | Yamazaki et al. |
| 2002/0158288 A1 | 10/2002 | Yamazaki et al. |
| 2003/0094614 A1 | 5/2003 | Yamazaki et al. |

OTHER PUBLICATIONS

Huang et al., "A Novel Submicron LDD Transistor With Inverse-T gate Structure", IEDM, vol. 86, pp. 742-745, 1986.

S. Kishino, "Novel fudamental of semiconductor device" Ohmesha LTD, 1995, pp. 201-207.

Seiki Ogura et al, "Design and Characteristics of the Lightly Doped Drain-Source (LDD) Insulated Gate Field-Effect Transistor", IEEE Transactions on Electron Devices, vol. ED-27, No. 8, Aug. 1980, pp. 1359-1367,.

* cited by examiner

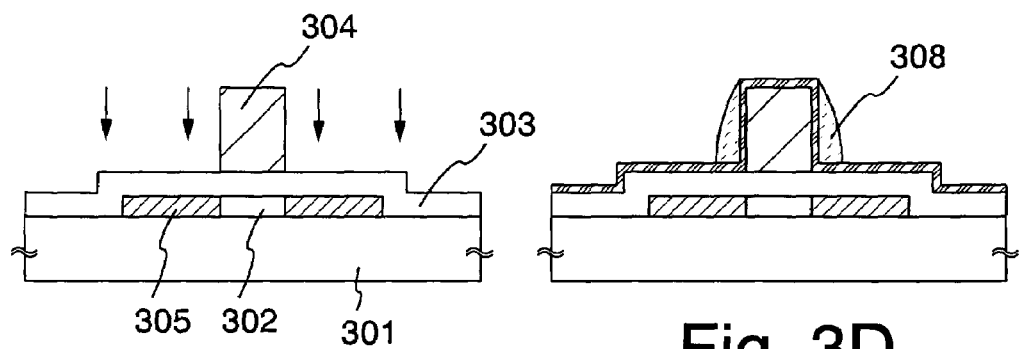
Fig. 3A
Fig. 3D
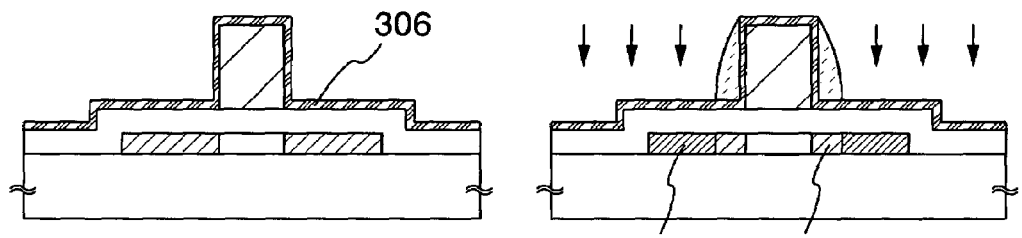
Fig. 3B
Fig. 3E
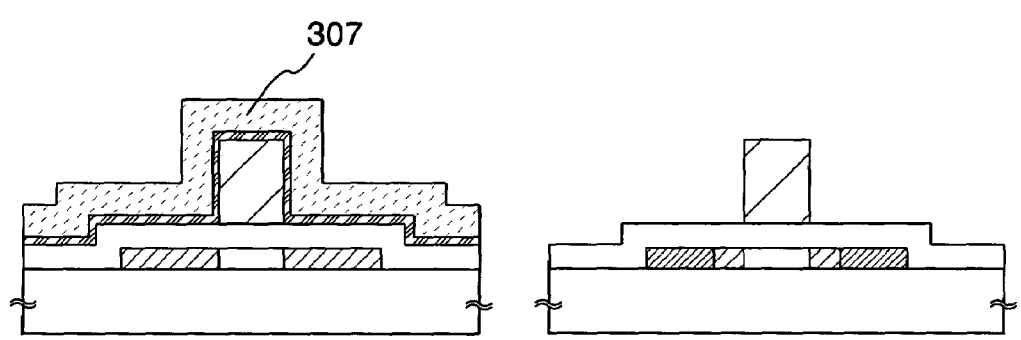
Fig. 3C
Fig. 3F

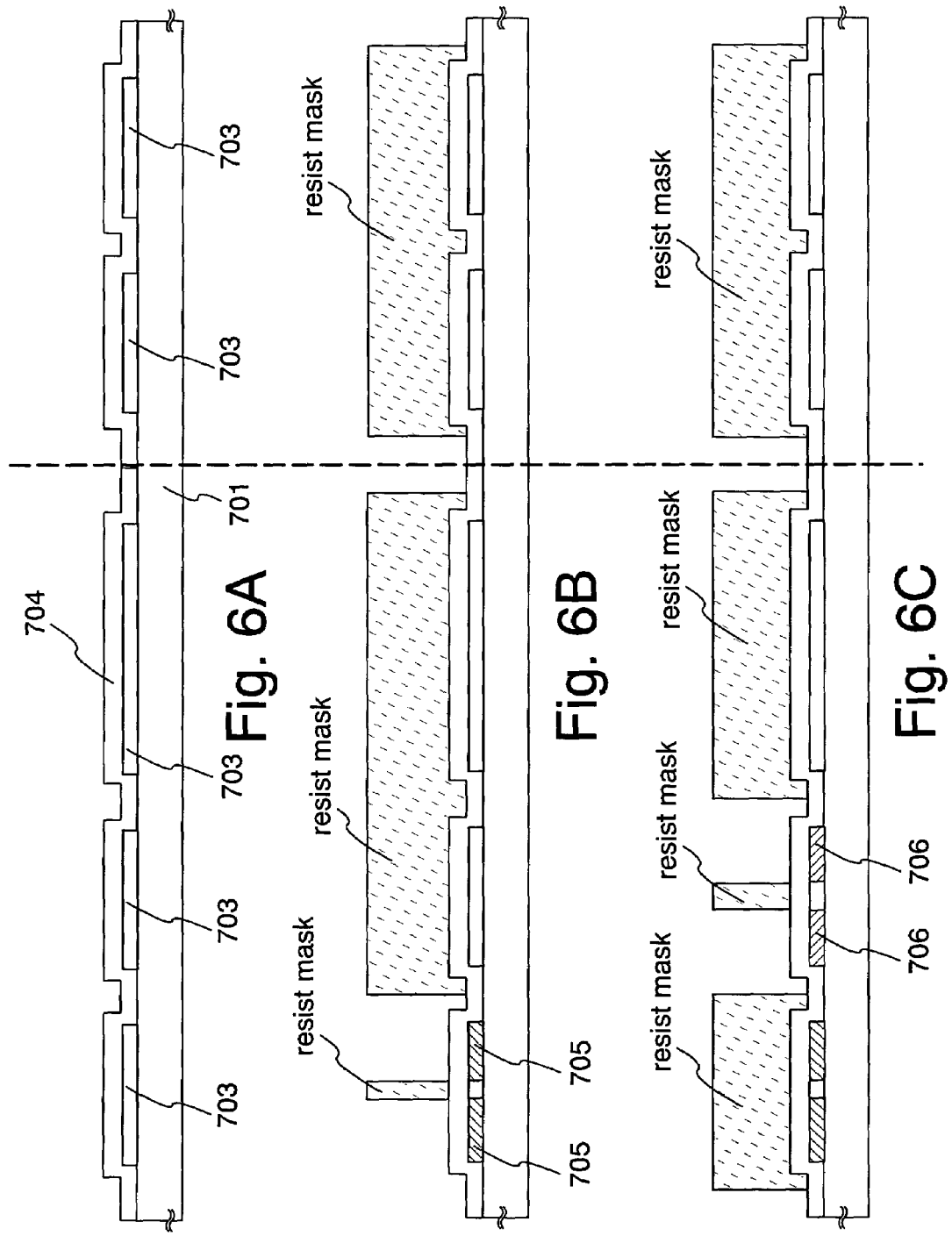

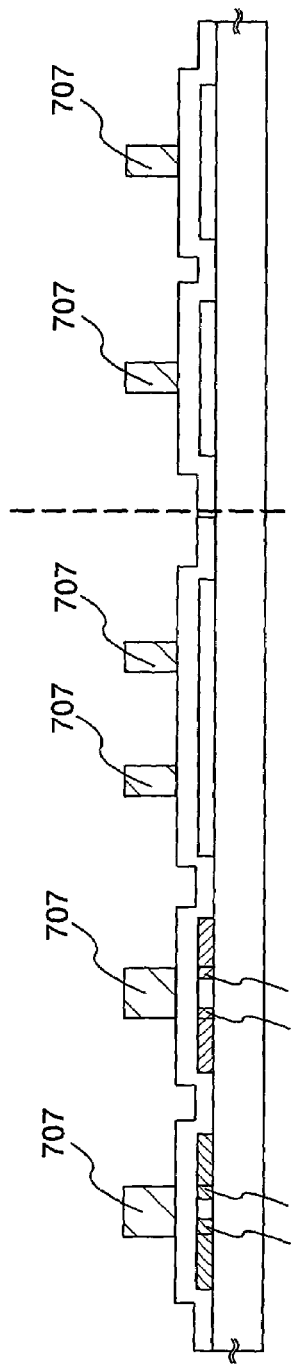
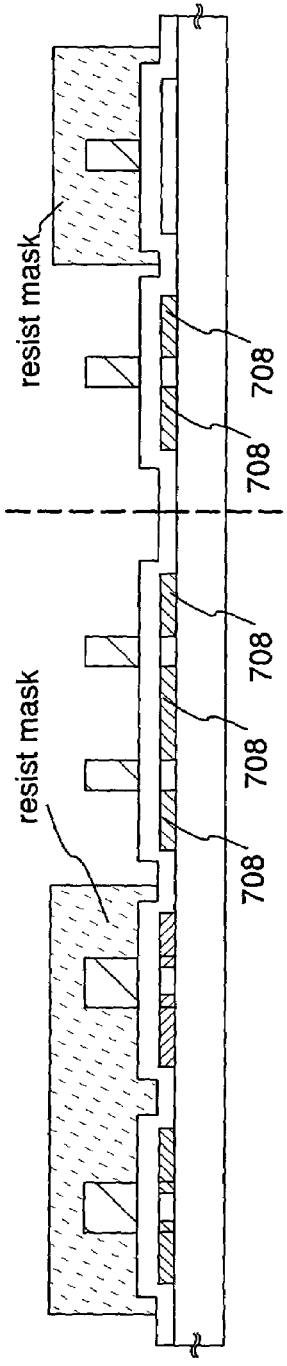
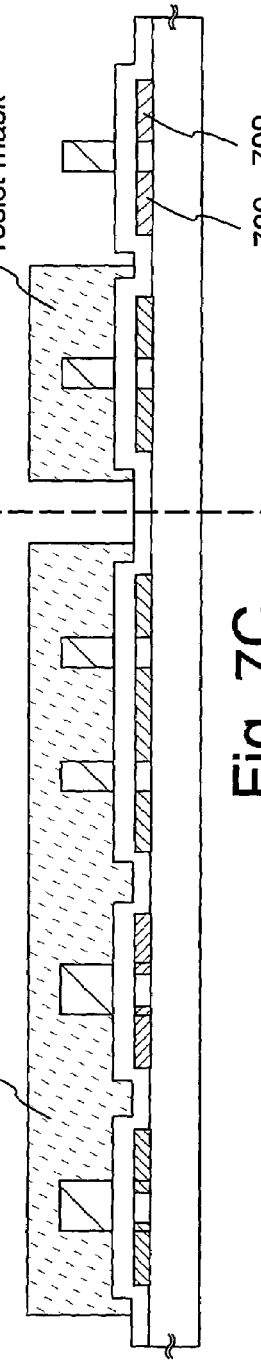
Fig. 7A
Fig. 7B
Fig. 7C

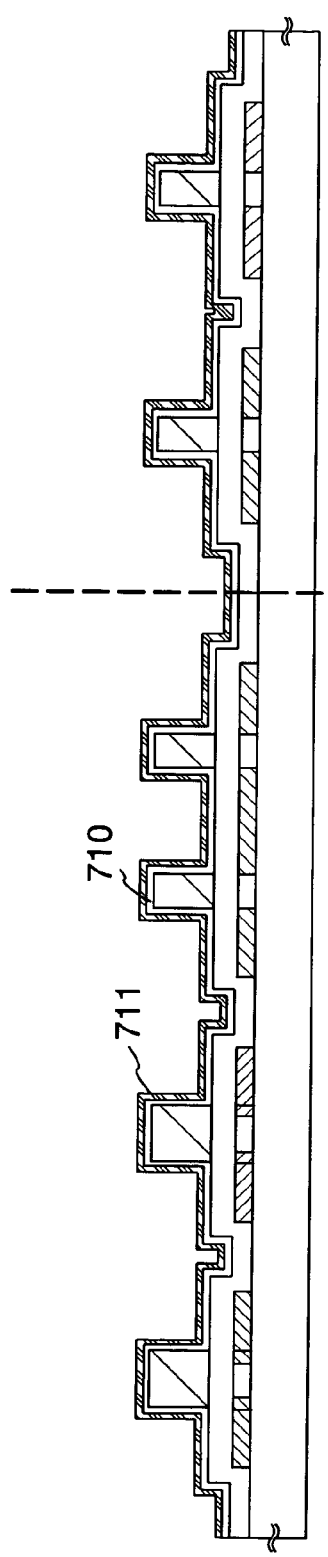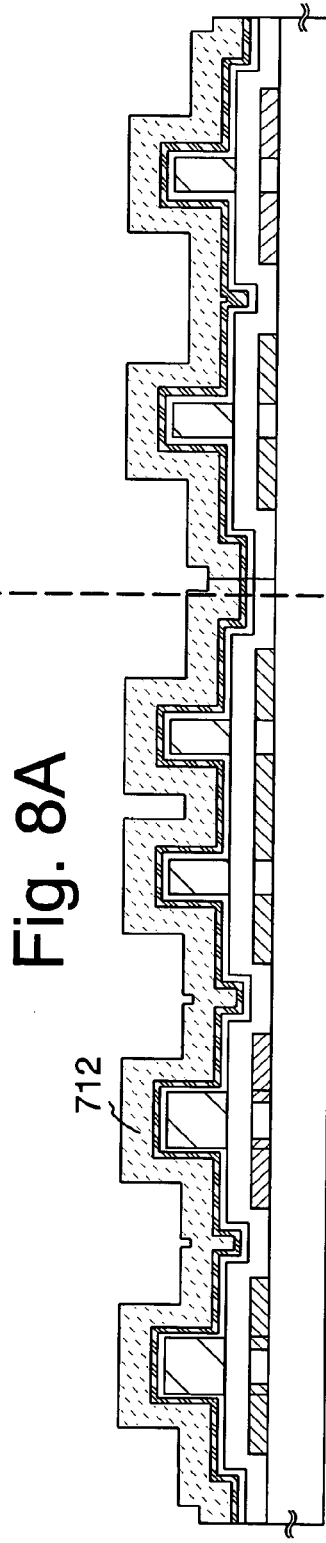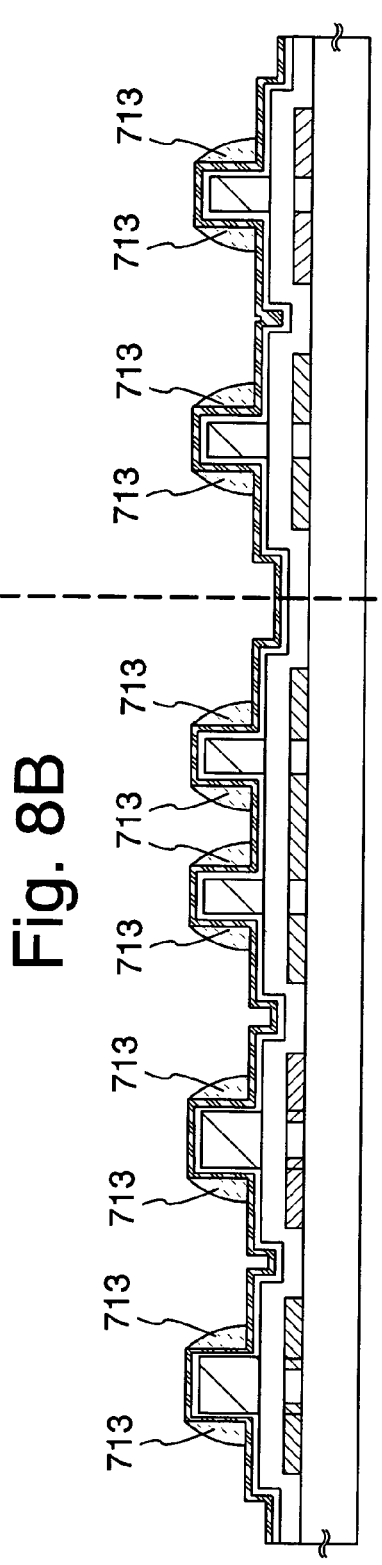

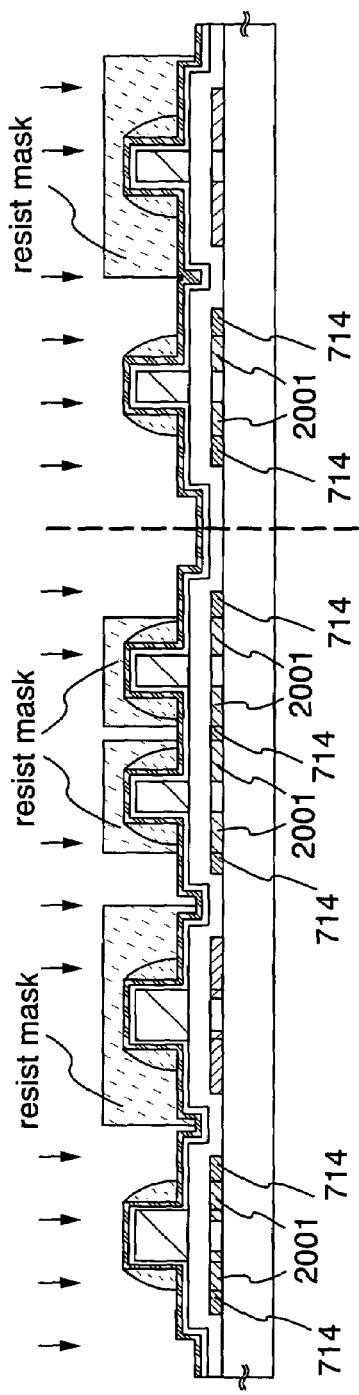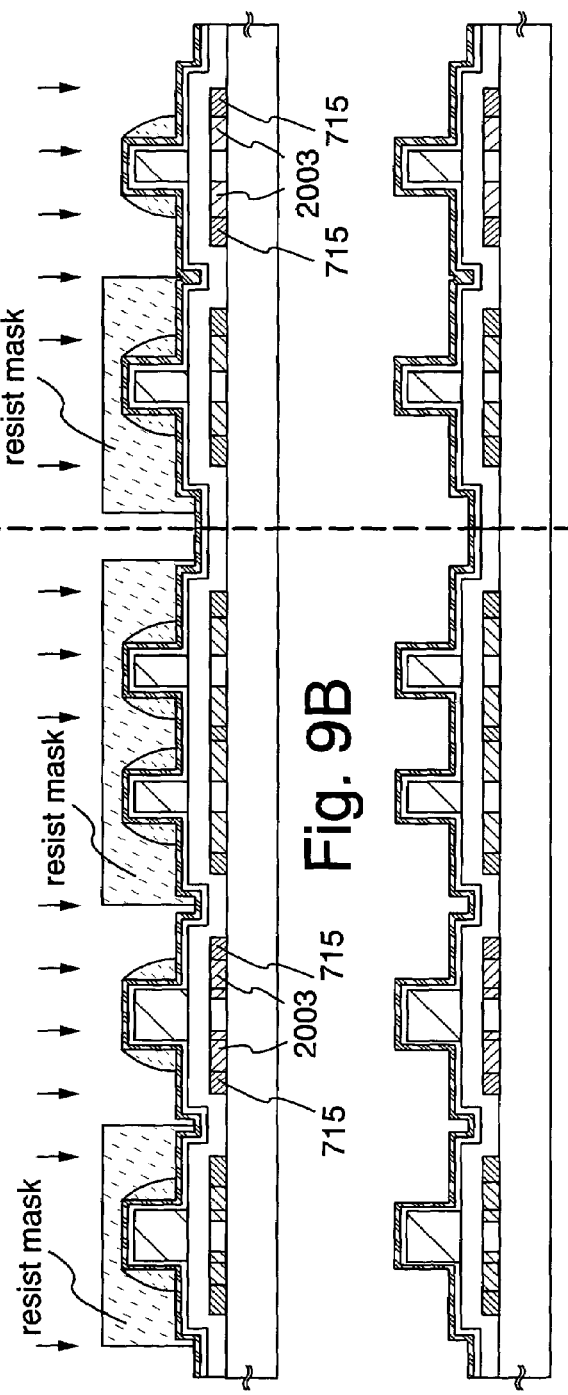

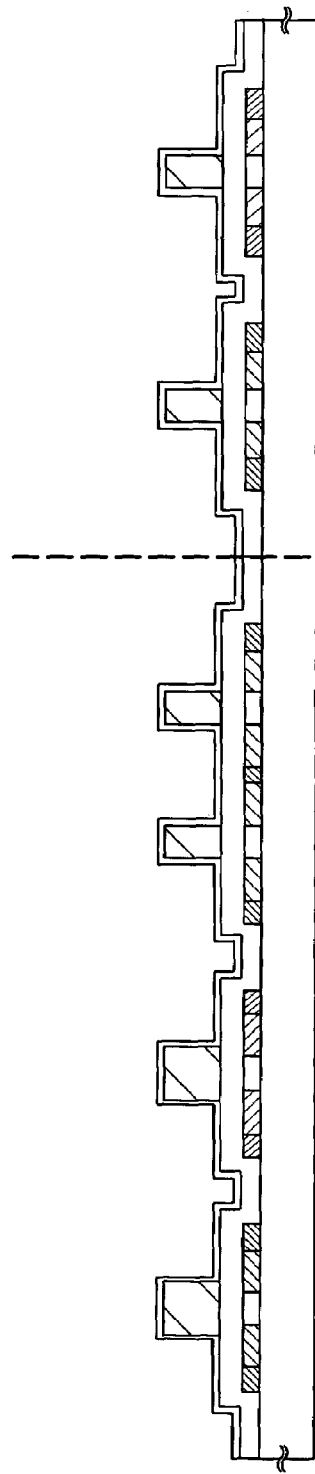
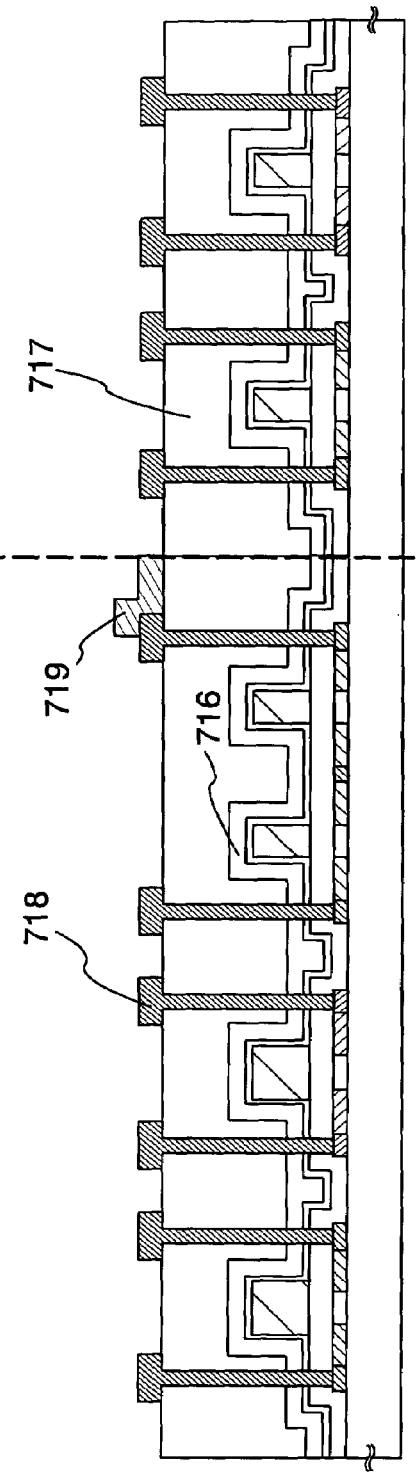
Fig. 10A
Fig. 10B

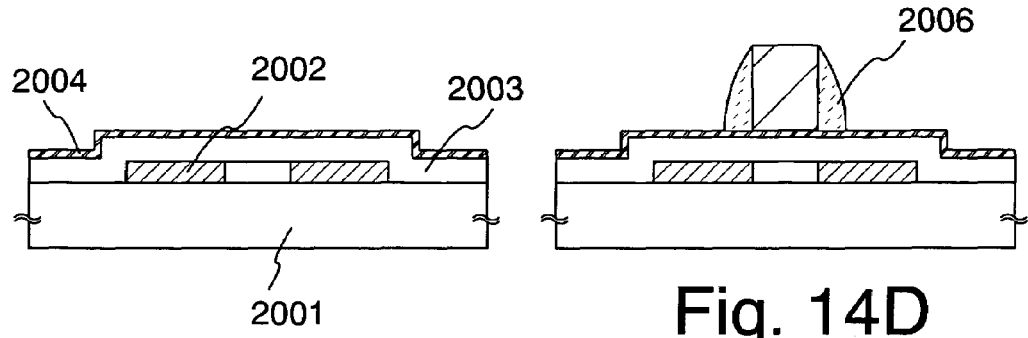
Fig. 14A
Fig. 14D
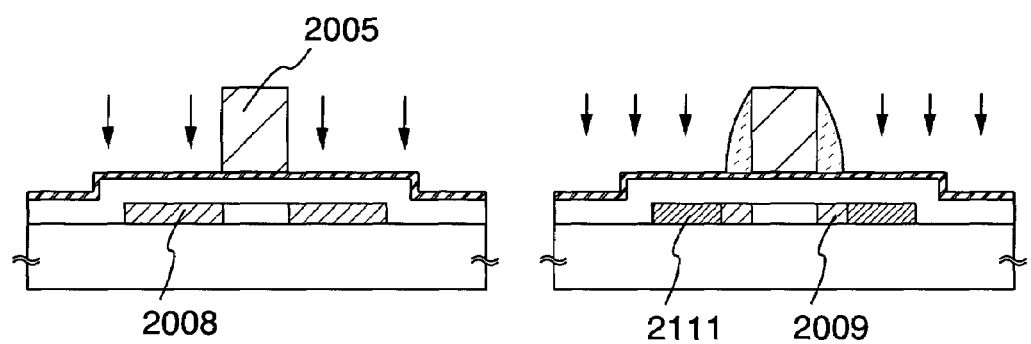
Fig. 14B
Fig. 14E
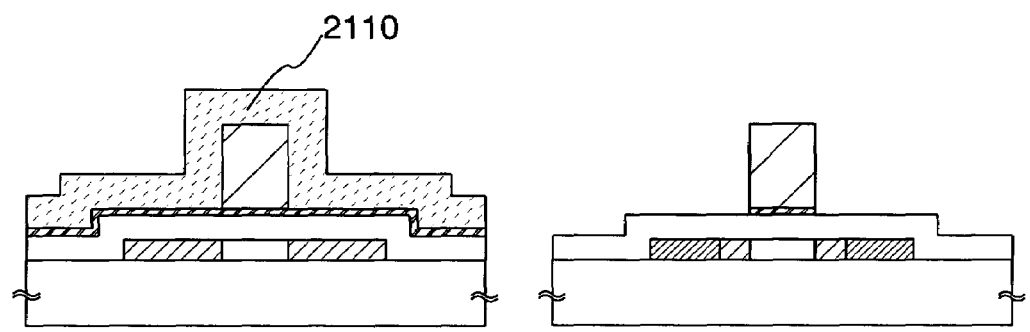
Fig. 14C
Fig. 14F

MANUFACTURING METHOD OF SEMICONDUCTOR DEVICE

BACKGROUND OF THE INVENTION

1. Field of the Invention

The present invention relates to a semiconductor device and a manufacturing method thereof. Specifically, the present invention relates to a semiconductor device in which an LDD (Lightly Doped Drain) region is formed in a self-aligning manner and a manufacturing method thereof.

2. Description of the Related Art

Recently, in the field of an image display device, the development of a system-on-panel incorporating logic circuits such as a memory circuit and a clock generating circuit, in addition to a pixel or a driver circuit, on an insulating substrate having transparence e.g. glass or quartz, has attracted attention. The technical development of manufacturing a TFT with high switching speed on an insulating substrate having transparence is required to realize high-speed operation for driver circuits and logic circuits. A TFT with high switching speed is manufactured by using a semiconductor film with fewer crystal defects and by miniaturizing an element size.

Even if an element size is miniaturized proportionally, drive voltage cannot always be reduced proportionally in order to keep signal speed and response speed. Consequently, the vicinity of a drain region becomes high electric field by miniaturizing an element size of a MOS transistor. Accordingly, electrons and holes having high energy, which are referred to hot carriers, are generated and caught in a gate insulating film. And it is known that this will cause a degradation phenomenon such as fluctuation in a threshold voltage.

It is effective to apply an LDD (Lightly Doped Drain) structure as an element structure. The LDD structure is formed by providing a low concentration impurity region in a drain end which is in contact with a channel. As low concentration impurities, an n-type impurity is used in the case of an n-channel element, while a p-type impurity is used in the case of a p-channel element. In this manner, electric field in the vicinity of the drain region is relaxed and the generation of hot carriers is controlled by making an impurity concentration gradient in the channel-drain junction. (For example, described in page 201–207 in "Novel fundamental of semiconductor device" written by S. Kishino, printed by Ohmsha, Ltd in year of 1995)

A degradation phenomenon caused by hot carriers is generated not only in a MOS transistor but also in a TFT. And it can be also prevented by applying an LDD structure as an element structure of a TFT as well as that of a MOS transistor.

The formation method of a general LDD structure in MOS transistor is described with reference to FIGS. 1A to 1D. However, the process through device isolation and the process after the formation of an LDD region are omitted here.

A gate insulating film 103 is formed on a semiconductor film 102 with device isolation. A gate electrode 104 made of polysilicon is formed on the gate insulating film 103. After forming the gate electrode 104 into a desired shape, ions at low concentration are doped into the semiconductor film 102. Next, a silicon oxide film 105 with isotropic step coverage is formed on the gate electrode 104. Then, sidewalls 106 are formed by performing anisotropic etching in vertical direction to leave the silicon oxide 105 only on the sidewalls of the gate electrode. A source and a drain regions 108 are formed by doping ions at high concentration in the semiconductor film 102 so that ions do not penetrate the sidewalls 106. The ions at high concentration are not doped into lower portions of the sidewalls 106, and then the lower portions of the sidewalls 106 are to be LDD regions 107.

As described above, an LDD region is formed in a self-aligning manner by using a sidewall without patterning. With miniaturization in an element size, there is a case in which alignment accuracy is required in a submarginal of the accuracy in a patterning process (approximately ±0.2 $\mu$m). In this case, an LDD region can be formed with higher accuracy in a self-aligning manner, instead of patterning. Hence, the above-described method is used when alignment accuracy is higher in the case of using a self-aligning manner in the formation of an LDD region.

An LDD region can be formed in a TFT by the same way as in a MOS transistor. However, since an insulating material such as a quartz substrate is used for forming a TFT, the TFT is easily to be charged and damaged by plasma especially in anisotropic etching to form sidewalls. In the element damaged by plasma, electrical charges in a gate insulating film and energy level in an interface between a semiconductor layer and a gate insulating layer are generated, and, as a result, deterioration such as fluctuation in threshold voltage is caused.

FIG. 2A shows a relationship between channel lengths of TFTs formed on a quartz substrate and threshold voltages thereof. According to FIG. 2A, when the channel length is 1 $\mu$m or less, the threshold voltage drops to a minus value, as low as 10 V is caused.

It is considered that such damage by plasma generated in the formation process of an LDD region is resulted from the difficulty in discharging electric charge accumulated in a gate electrode of which surface area is reduced by processing into a desired shape, and results in having serious impact on an element characteristic. Therefore, a good deal of damage by plasma is caused, since the charge density which is to be accumulated in the gate electrode increase, as the surface area of the gate electrode is reduced by miniaturization of an element size and as the thickness of the gate insulating film is reduced. Damage by electric charged accumulated in a gate electrode which is miniaturized in the case of doping charged particles, in the same way as the case of anisotropic etching.

However, the miniaturization of an element size is required more and more in order to manufacture TFTs with high switching speed which is essential for an element of logic operation circuit, and in order to obtain a higher integration. Accordingly, the development of manufacturing method of TFTs having LDD structures, which can take advantage of self aligning manner having high manufacturing accuracy and decrease the damage by the plasma and doping process as much as possible is needed.

SUMMARY OF THE INVENTION

It is an object of the present invention to provide a manufacturing method of a semiconductor device that can form an LDD region in self aligning manner and minimize damage by plasma and doping process as much as possible. According to the present invention, the manufacturing method of a semiconductor device is characterized in, by anisotropic etching during LDD formation, reducing the charge density to be stored in a gate electrode, and preventing damage by plasma as much as possible. This is achieved by LDD formation under the state that a conductive protecting film is formed in such a manner as to cover a substrate in its entirety. At the same time, the method is also characterized in preventing damage as much as possible caused by charged particles during a process of adding a high concentration of impurity for a source and a drain regions formation.

A first aspect of the present invention is directed to a manufacturing method of a semiconductor device, including the steps of: forming a gate electrode by forming a first conductive film on a gate insulating film and processing the first conductive film; adding a low concentration of impurity to the semiconductor film while using the gate electrode as a mask; forming a conductive protecting film as a result of forming a second conductive film covering a substrate in its entirety over the gate insulating film and the gate electrode; forming a sidewall to a side surface of the gate electrode covered by the conductive protecting film; adding a high concentration of impurity to the semiconductor film while using the gate electrode and the sidewall as masks; removing the sidewall; and removing the conductive protecting film.

As shown in FIG. 3, a semiconductor film 302 that has been subjected to device isolation is formed on an insulating substrate 301. On thus formed semiconductor film 302, a gate insulating film 303 is formed.

Then, the gate insulating film 303 is formed with a first conductive film thereon, and a gate electrode 304 is formed through a process.

While the gate electrode 304 is used as a mask, a low concentration of impurity is added to the semiconductor film 302 so as to form a low-concentration impurity region 305.

Another conductive film is formed over the gate insulating film 303 and the gate electrode 304 in such a manner as to cover the substrate in its entirety, forming a conductive protecting film 306. The conductive protecting film 306 may be made of a material capable of etching with a high selection ratio between the gate insulating film 303 and the gate electrode 304.

Next, on the conductive protecting film 306, an insulating film (or conductive film) 307 may be formed for sidewall formation.

Thus formed insulating film 307 is selectively processed through anisotropic etching mainly in the vertical direction, so that a sidewall 308 is formed to the side surface of the gate electrode 304 covered by the conductive protecting film 306. In this manner, the conductive protecting film 306 is sandwiched between the side surface of the gate electrode 304 and the sidewall 308.

At the time of anisotropic etching for sidewall formation, the conductive protecting film 306 is formed to cover the substrate in its entirety. Accordingly, the electric charge to be generated during anisotropic etching is stored mainly in the conductive protecting film 306 having conductivity. Further, the surface area of the conductive protecting film 306 is very large. This makes the electric charge density to be stored very small, thereby reducing damage by plasma generated during anisotropic etching.

Next, the semiconductor film 302 is added with a high concentration of impurity while the gate electrode 304 and the sidewall 308 are used as masks, thereby forming a source and a drain regions 309. At this time, the low-concentration impurity region 305 locating below the sidewall 308 becomes an LDD region 310 without being provided with the high concentration of impurity.

After addition of the high concentration of impurity, any unneeded sidewall 308 is selectively removed, and the conductive protecting film 306 is also selectively removed.

As such, even in the process of impurity addition (doping process), the conductive protecting film 306 remains covering the substrate in its entirety, and the surface area thereof is rather large. Thus, the charge density to be stored in the conductive protecting film 306 is reduced to a great degree by generation of charged particles. Accordingly, this can reduce damage to be caused by the doping process.

The above described method favorably leads to a semiconductor device allowing self-aligning LDD formation, and preventing damage to be caused by a plasma process and a doping process as much as possible.

The present invention is directed to a manufacturing method of a semiconductor device, including the steps of: forming a gate electrode by forming a first conductive film on a gate insulating film and processing the first conductive film; adding a low concentration of impurity to the semiconductor film while using the gate electrode as a mask; forming an insulative protecting film as a result of forming an insulating film over the gate insulating film and the gate electrode in such a manner as to cover a substrate in its entirety; forming a conductive protecting film as a result of forming a second conductive film on the insulative protecting film; forming a sidewall to a side surface of the gate electrode covered by the conductive protecting film and the insulative protecting film; adding a high concentration of impurity to the semiconductor film while using the gate electrode and the sidewall as masks; removing the sidewall; and removing the conductive protecting film.

As an example, at the time of manufacturing such a semiconductor device as described above, if the gate electrode and the conductive protecting film are made of the same material, or made of any material not allowing etching with a high selection ratio, resulting in removal of the gate electrode at the same time of removal of the conductive protecting film.

To prevent this, the gate electrode and the conductive protecting film are provided with an insulative protecting film therebetween, being capable of etching showing the high selection ratio to the conductive protecting film.

This insulative protecting film may be removed after the conductive protecting film is removed. Alternatively, without removing, it may be used as a part of the interlayer insulating film.

The present invention is directed to a manufacturing method of a semiconductor device, including the steps of: forming a conductive protecting film as a result of forming a first conductive film on a gate insulating film in such a manner as to cover a substrate in its entirety; forming a gate electrode by forming a second conductive film on the conductive protecting film and processing the second conductive film; adding a low concentration of impurity to the semiconductor film while using the gate electrode as a mask; forming a sidewall to a side surface of the gate electrode; adding a high concentration of impurity to the semiconductor film while using the gate electrode and the sidewall as masks; removing the sidewall; and processing the conductive protecting film while using the gate electrode as a mask.

In the manufacturing method of a semiconductor device described above, the conductive protecting film is formed in such a manner as to cover the whole gate electrode after the gate electrode is formed. Alternatively, the conductive protecting film may be formed before the gate electrode is formed.

Referring to FIGS. 14A to 14E, a description is made about this case. On an insulating substrate 2001, a semiconductor film 2002 with device isolation is formed. Thereafter, on thus formed semiconductor film 2002, a gate insulating film 2003 is formed.

Then, a conductive protecting film 2004 is formed as a result of forming a conductive film on a gate insulating film 2003 in such a manner as to cover the substrate in its entirety.

Next, on thus formed conductive protecting film 2004, formed is another conductive film made of a different material from the conductive protecting film 2004. The resulting conductive film is then processed to form a gate electrode 2005.

A low-concentration impurity region 2008 is then formed by adding a low concentration of impurity to the semiconductor film 2002 while using the gate electrode 2005 as a mask, in such a manner as to go through the conductive protecting film 2004 and the gate insulating film 2003.

Next formed is an insulating film (or conductive film) 2010 in such a manner as to cover the gate electrode 2005. Thus formed insulating film (or conductive film) is selectively processed by anisotropic etching mainly in the vertical direction, forming a sidewall 2006.

At the time of anisotropic etching for sidewall formation, the conductive protecting film 2004 has been formed to cover the substrate in its entirety. Accordingly, the electric charge to be generated during anisotropic etching is stored mainly in the conductive protecting film 2004 having conductivity. Further, the surface area of the conductive protecting film 2004 is very large. This makes the electric charge density to be stored very small, thereby reducing damage by plasma generated during anisotropic etching.

Next formed is a source and a drain regions 2111 by adding a high concentration of impurity to the semiconductor film 2002 while using the gate electrode 2005 and the sidewall 2006 as masks, in such a manner as to go through the conductive protecting film 2004 and the gate insulating film 2003. At this time, out of the low-concentration impurity region 2008 that has been already formed, any region having no high-concentration impurity formed becomes an LDD region 2009.

Then, the sidewall 2006 is removed through selective etching, and the conductive protecting film 2004 is processed through etching while the gate electrode 2005 is used as a mask. After such a process, the conductive protecting film 2004 left laminated with the gate electrode 2005 is used as a part of the gate electrode.

As such, even in the process of impurity addition (doping process), the conductive protecting film 2004 remains covering the substrate in its entirety, and the surface area thereof is rather large. Thus, the charge density to be stored in the conductive protecting film 2004 is reduced to a great degree by generation of charged particles. Accordingly, this can reduce damage to be caused by the doping process.

The above method successfully leads to a semiconductor device allowing self-aligning LDD formation, and preventing damage to be caused by a plasma process and a doping process as much as possible.

According to the present invention, the manufacturing method of a semiconductor device further includes the step of processing the conductive protecting film while using the gate electrode and the sidewall as masks after the process of adding the high concentration of impurity.

In the above described manufacturing method of a semiconductor device including the process of forming a conductive protecting film before a gate electrode is formed, alternatively, a Gate Overlapped LDD region can be formed by processing the conductive protecting film after adding a high concentration of impurity. At the time of process, the sidewall is not removed to use it as a mask together with the gate electrode. In this case, if the sidewall has been made of an insulative material, the sidewall may be used as a part of the interlayer insulating film without being removed. Even in a case where the sidewall has been made of a conductive material, it may be used as a part of the gate electrode.

BRIEF DESCRIPTION OF THE DRAWINGS

In the accompanying drawings:

FIGS. 3A to 3F are cross-sectional views showing an LDD formation process in the present invention;

FIGS. 6A to 6C are cross-sectional views showing a manufacturing process of a TFT array substrate in which a logic operation circuit TFT, a driver circuit TFT and a pixel TFT of a liquid crystal display device are formed on one substrate;

FIGS. 7A to 7C are cross-sectional views showing a manufacturing process of a TFT array substrate in which a logic operation circuit TFT, a driver circuit TFT and a pixel TFT of a liquid crystal display device are formed on one substrate;

FIGS. 8A to 8C are cross-sectional views showing a manufacturing process of a TFT array substrate in which a logic operation circuit TFT, a driver circuit TFT and a pixel TFT of a liquid crystal display device are formed on one substrate;

FIGS. 9A to 9C are cross-sectional views showing a manufacturing process of a TFT array substrate in which a logic operation circuit TFT, a driver circuit TFT and a pixel TFT of a liquid crystal display device are formed on one substrate;

FIGS. 10A and 10B are cross-sectional views showing a manufacturing process of a TFT array substrate in which a logic operation circuit TFT, a driver circuit TFT and a pixel TFT of a liquid crystal display device are formed on one substrate;

FIGS. 14A to 14F are cross-sectional views showing an LDD formation process in the present invention;

DETAILED DESCRIPTION OF THE PREFERRED EMBODIMENTS

Embodiment Mode 1

Figure 1A:
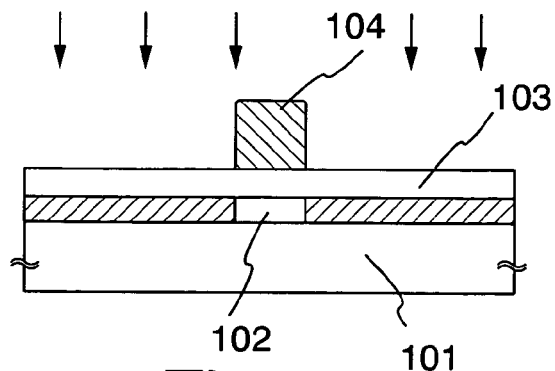
FIGS. 1A to 1D are cross-sectional views showing an LDD formation process in a related art.
Figure 1B:
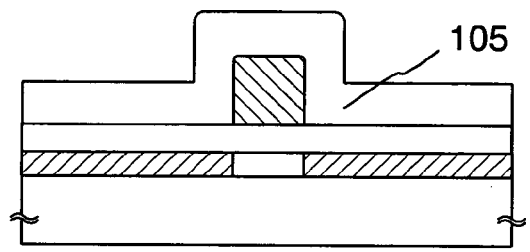
Figure 1C:
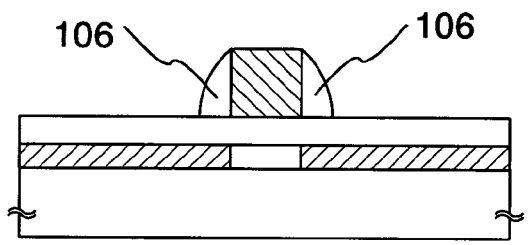
Figure 1D:
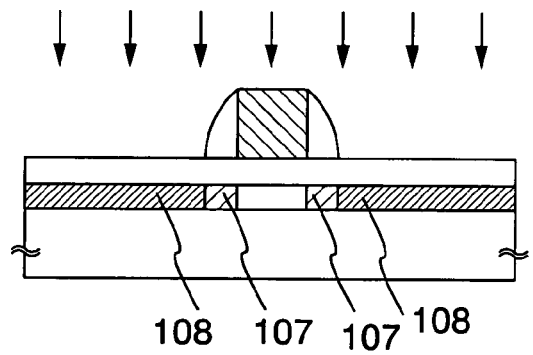

Referring to FIGS. 4A to 4E and 5A to 5E, an embodiment mode of the present invention is described. Herein, described is a method for manufacturing a TFT having an LDD (Lightly Doped Drain) structure allowing self-aligning LDD formation, and preventing damage by plasma as much as possible.

FIGS. 4A to 4E and 5A to 5E are cross-sectional views showing the method for manufacturing a TFT having an LDD structure in the present invention.

On a quartz substrate 401, formed are island-shaped semiconductor films 402 each independently placed. On thus formed semiconductor films 402, a gate insulating film 403 is then formed by forming a silicon oxide film having a thickness of 40 nm. Thereafter, on the gate insulating film 403, a crystalline silicon film (in the below, simply referred to as n+poly-Si film) and a tungsten silicide (WSix) film are laminated. Herein, the n+poly-Si film has a thickness of 150 nm and includes phosphorus, and the WSix film also has a thickness of 150 nm. Thus laminated layers are processed to form a gate electrode 404. Note here that the gate electrode 404 is not restrictive to the above, and can be formed by using any conductive material as one layer or lamination film of two or more layers.

Next formed is an n-type impurity region 405 containing a low concentration of $5 \times 10^{16}$ to $5 \times 10^{17}$ atoms/cm$^3$ by masking a region to be a p-channel TFT using a resist, and by adding phosphorus being an n-type impurity to the semiconductor film 402 of a region to be an n-channel TFT while using the gate electrode 404 as a mask.

Thereafter, a p-type impurity region 406 containing a low concentration of $5 \times 10^{16}$ to $5 \times 10^{17}$ atoms/cm$^3$ is formed by masking a region to be the n-channel TFT using a resist, and by adding boron being a p-type impurity to the semiconductor film 402 of a region to be the p-channel TFT while using the gate electrode 404 as a mask.

On the gate electrode 404, an insulative protecting film 407 is formed by forming a silicon oxide film having a thickness of 20 to 50 nm in such a manner as to cover the substrate in its entirety.

On thus formed insulative protecting film 407, a conductive protecting film 408 is formed by forming an n+poly-Si film having conductivity with 40 to 60 nm thickness.

On thus formed conductive protecting film 408, a sidewall film 409 is formed by forming a silicon oxide film with 300 to 500 nm in thickness. The silicon oxide film shows better step coverage even if the object is uneven. The sidewall film 409 is then selectively subjected to anisotropic etching process mainly in the vertical direction. This forms a sidewall 410.

Herein, the total thickness of the insulative protecting film 407, the conductive protecting film 408, and the sidewall film 409 is the LDD length. Note here that if etching or washing before film formation has reduced the film thickness, the LDD length is the value derived by deducting or adding the reduced thickness from or to the total thickness of the insulative protecting film 407, the conductive protecting film 408, and the sidewall film 409. In this case, if the sidewall film covering the side surface of the gate electrode 404 is not equal in length to that over the upper plane of the gate electrode 404, the former length is used as a determination factor, namely, the thickness of the sidewall film 409, for the LDD length.

Accordingly, to achieve any desired LDD length, there only needs to appropriately adjust, in thickness, the insulative protecting film 407, the conductive protecting film 408, and/or the sidewall film 409. Although their thickness is not restrictive to the above-mentioned, consideration still has to be given as below to determine the film thickness. That is, for example, the insulative protecting film 407 has to have a thickness serving as an etching stopper when the conductive protecting film is removed, and the conductive protecting film has to have a thickness sufficient for preventing damage by plasma at the time of anisotropic etching, i.e., for suppressing low the charge density to be stored. Also consideration is required in which the total thickness of the gate insulating film 403, the insulative protecting film 407, and the conductive protecting film 408 which is sufficient for impurity addition there through to the semiconductor film 402 in the subsequent process.

Next formed is a source and a drain regions 415 with phosphorous of $1 \times 10^{19}$ to $1 \times 10^{21}$ atoms/cm$^3$ by masking a region to be the p-channel TFT using a resist, and by adding phosphorus being an n-type impurity to the semiconductor film 402 of a region to be the n-channel TFT while using the gate electrode 404 and the sidewall 410 as masks. At this time, the low-concentration n-type impurity region 405 locating below the sidewall 410 becomes an LDD region 411.

Thereafter, a source and a drain regions 416 with boron of $1 \times 10^{19}$ to $1 \times 10^{21}$ atoms/cm$^3$ is formed by masking a region to be the n-channel TFT using a resist, and by adding boron being a p-type impurity to the semiconductor film 402 of a region to be the p-channel TFT while using the gate electrode 404 and the sidewall 410 as masks. At this time, the low-concentration p-type impurity region 406 locating below the sidewall 410 becomes the LDD region 412.

The sidewall 410 is then selectively subjected to an etching process for removal using a solution including a hydrofluoric acid.

The conductive protecting film 408 is also selectively subjected to an etching process for removal using a tetramethyl-hydroxide (TMAH) solution. At this time, the n+poly-Si film as a part of the gate electrode 404 is protected by the insulative protecting film 407, whereby no etching is done thereto using the TMAH solution.

For the purpose of using the insulative protecting film 407 as a part of the interlayer film, a silicon oxide film of 40 nm is formed thereover to form an interlayer insulating film 413. Then, a heat activation process is applied thereto. Further, after contact halls are formed, necessary wiring 414 is formed, and then a hydroxide process is applied.

As such, going through the above processes favorably leads to a TFT having an LDD structure allowing self-aligning LDD formation, and preventing damage by plasma as much as possible.

Figure 2A:
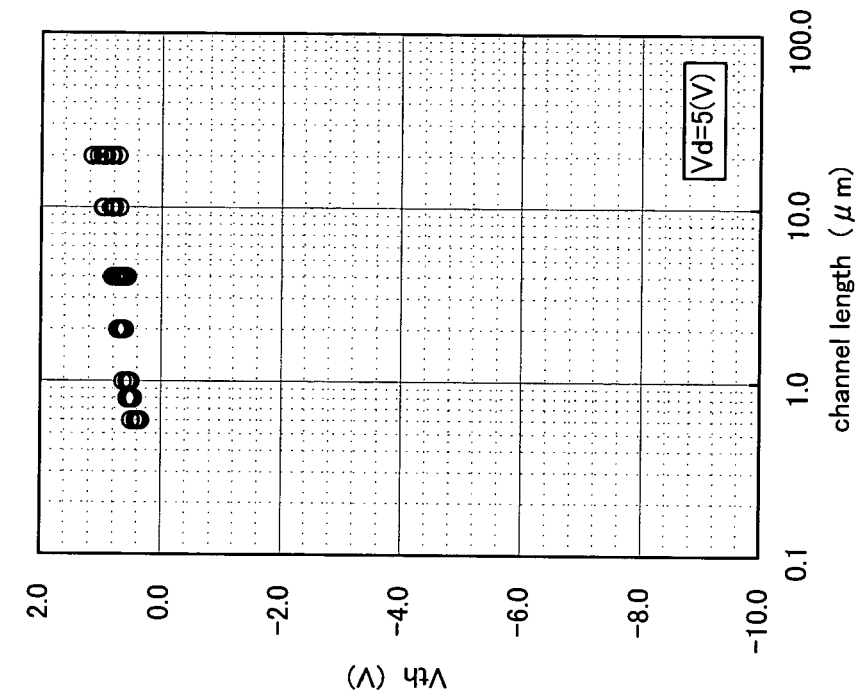
FIGS. 2A and 2B show a relationship between channel lengths of TFTs and threshold voltages thereof.
Figure 2B:
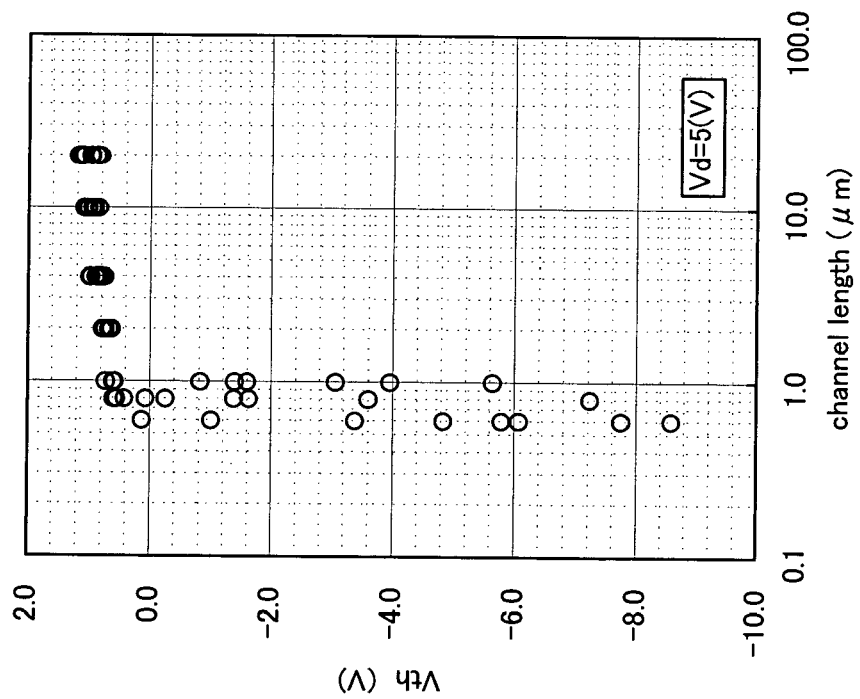
Figure 4A:
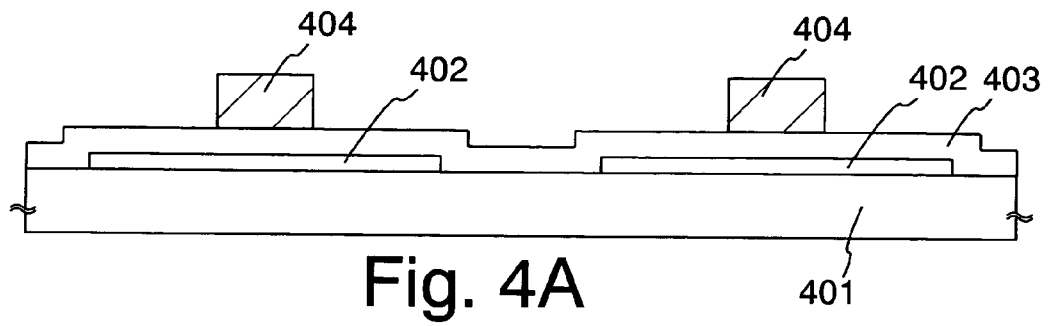
FIGS. 4A to 4E are cross-sectional views showing a manufacturing process of a TFT having a LDD structure.
Figure 4B:
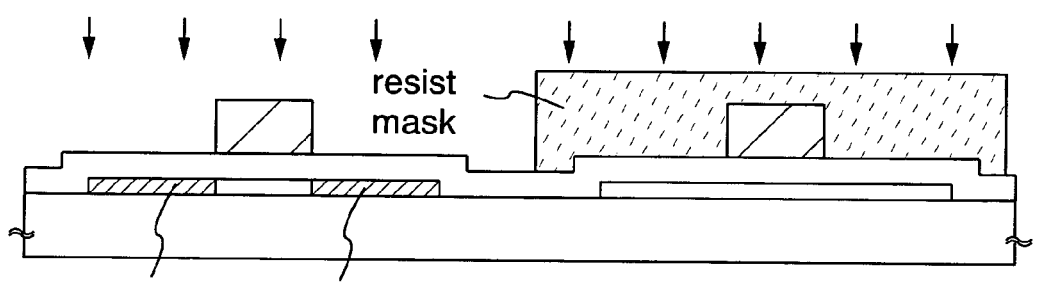
Figure 4C:
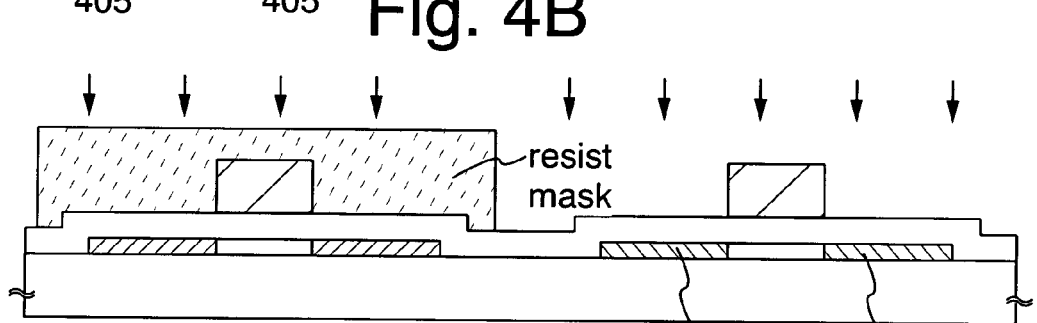
Figure 4D:
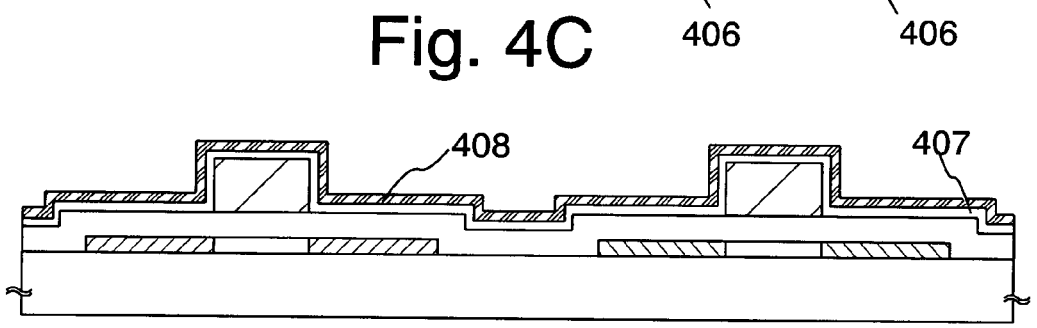
Figure 4E:
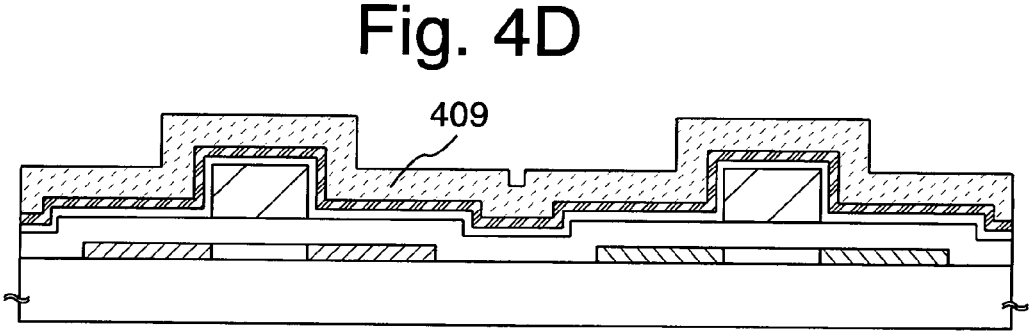
Figure 5A:
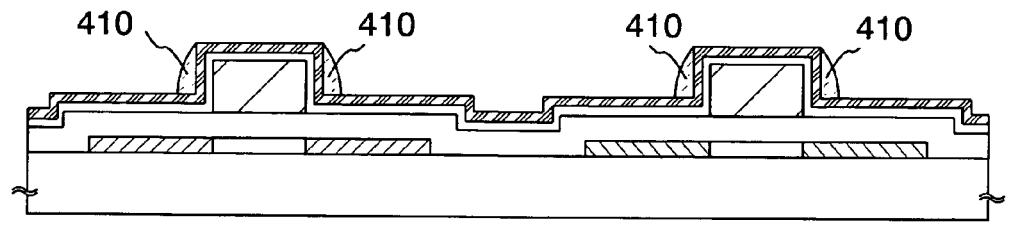
FIGS. 5A to 5E are cross-sectional views showing a manufacturing process of a TFT having a LDD structure.
Figure 5B:
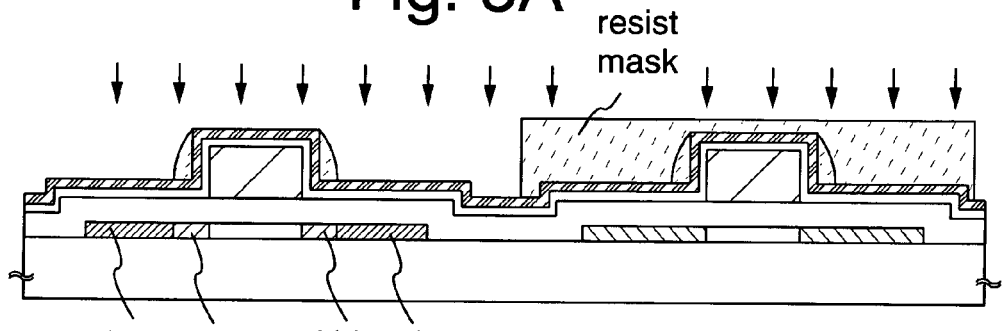
Figure 5C:
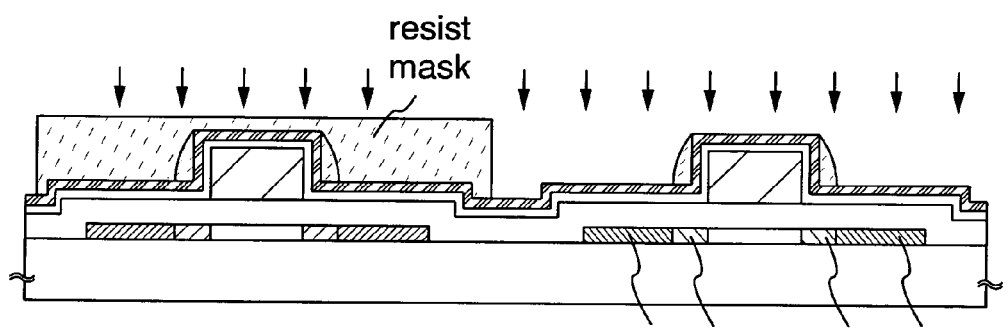
Figure 5D:
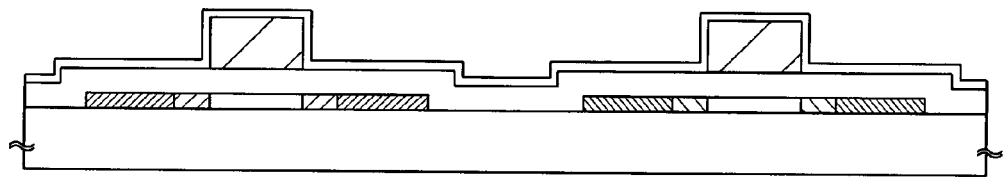
Figure 5E:
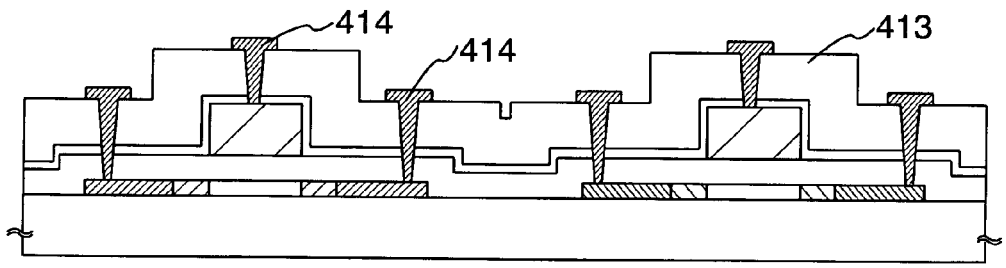

FIG. 2B shows the relationship between the threshold voltages and the channel lengths of the resulting n-channel type TFTs manufactured according to the above described processes. Compared with the TFTs as a result of LDD formation using the conventional technology as shown in FIG. 2A, the n-channel TFTs of FIG. 2B obviously show better characteristics. This is known from the fact that even if the channel lengths of the TFTs are 1.0 μm or shorter, elements show no such abnormality as the threshold voltage fluctuates in a range of about 10V.

It should be noted that, in FIGS. 2A and 2B, the TFTs used for measurement are all n-channel TFTs each having the gate width of 20.0 μm. The measurement is conditionally done with the drain voltage being 5V, and the threshold voltage being the one derived by using the measurement result of Vg–Id characteristics at room temperature. For measurement, used are nine TFTs of the same size on a substrate. The TFT of the conventional technology and the TFT with the manufacturing method of the present invention use the same manner for semiconductor film formation, the same process for interlayer formation (heat process requirements included), and the like. The only difference therebetween in the TFTs manufacturing process is the presence or absence of the conductive and insulative protecting films at the time of LDD formation.

As such, the manufacturing method of a semiconductor device of the present invention works effectively for manufacturing a fine TFT having the channel length of 2.0 μm or shorter. The method also works effectively for manufacturing a logic operation circuit using such fine TFTs.

Embodiment Mode 2

An embodiment mode of the present invention is described with reference to FIGS. 15A to 15E and FIGS. 16A to 16E. A manufacturing method of a TFT having an LDD region by which the LDD region can be made in a self-aligning manner and damage by plasma is reduced as much as possible is described here.

FIGS. 15A to 15E and FIGS. 16A to 16E are cross-sectional views showing manufacturing processes of a TFT having an LDD structure according to the present invention.

An island-shaped semiconductor film 2201 is formed on a glass substrate 2200. On the semiconductor film 2201, a silicon oxide film is formed with a thickness of 30 to 60 nm to form a gate insulating film 2216. Then, a tantalum nitride (TaN) film with a thickness of 20 to 50 nm is formed on the gate insulating film 2216 for serving as a conductive protecting film 2202. As the conductive protecting film 2202, films having conductive property in addition to TaN may be used. However, with respect to a film thickness of TaN, the film thickness into which impurities can penetrate is required, since impurities are penetrated into the conductive 2202 and the gate insulating film 2216 and doped into the semiconductor device 2201 in the following process.

On the conductive protecting film 2202, tungsten (W) is formed to a thickness of 300 to 600 nm, and then, processed to form a gate electrode 2203 by patterning and etching. As a material for the gate electrode 2203, films having conductive property in addition to tungsten may be used. However, it is necessary that the conductive protecting film 2202 and the gate electrode 2203 are made from different materials, since the conductive protecting film 2202 is etched by using the gate electrode 2203 as a mask in the following process.

Next, a region for a p-channel TFT is masked with a resist mask, and then, n-type impurity of phosphorous is doped into the semiconductor film 2201 which becomes an n-type TFT by penetrating into the conductive protecting film 2202 and a gate insulating film 2216 by using the gate electrode 2203 as a mask. In this manner, an n-type impurity region 2204 is formed with a low concentration in the range with phosphorous of $5 \times 10^{16}$ to $5 \times 10^{17}$ atoms/cm$^3$.

Further, a region for an n-channel TFT is masked with a resist mask, and then, p-type impurity of boron is doped into the semiconductor film 2201 which becomes a p-type TFT by penetrating into the conductive protecting film 2202 and a gate insulating film 2216 by using the gate electrode 2203 as a mask. In this manner, a p-type impurity region 2205 is formed with a low concentration in the range of $5 \times 10^{16}$ to $5 \times 10^{17}$ atoms/cm$^3$.

A silicon oxide film having good step coverage is formed with a thickness of 400 to 600 nm on the gate electrode 2203 so that a whole surface of the substrate is covered, and thus, a sidewall film 2206 is formed. The sidewall film 2206 is selectively etched perpendicularly by anisotropic etching in order to form a sidewall 2207. A film having conducting property or a film having insulating property may be used as the sidewall film 2206 instead of the silicon oxide film. However, it is necessary that the conductive protecting film 2202 and the gate electrode 2203 are made from different materials so that etching can be performed selectively.

A film thickness of the sidewall 2206 corresponds to a length of an LDD region. Therefore, the film thickness of the sidewall 2206 may be adjusted to obtain a desired length of the LDD region. The length of the LDD region is not limited to the range of the film thickness described above.

Next, a region for a p-channel TFT is masked with a resist mask, and then, n-type impurity of phosphorous is doped into the semiconductor film 2201 which becomes an n-type TFT by penetrating the conductive protecting film 2202 and the gate insulating film 2216, by using the gate electrode 2203 and the sidewall 2206 as a mask in order to form a source and a drain regions 2208 with $1 \times 10^{19}$ to $1 \times 10^{21}$ atoms/cm$^3$. A low concentration of n-type impurity region 2204 in the lower portion of the sidewall 2206 becomes an LDD region 2209.

Next, a region for forming an n-channel TFT is masked with a resist mask, and then, p-type impurity of boron is doped into the semiconductor film 2201 which becomes a p-type TFT by penetrating the conductive protecting film 2202 and the gate insulating film 2216, by using the gate electrode 2203 and the sidewall 2206 as a mask in order to form a source and a drain regions 2210 with boron of $1 \times 10^{19}$ to $1 \times 10^{21}$ atoms/cm$^3$. A low concentration of p-type impurity region 2205 in the lower portion of the sidewall 2207 becomes an LDD region 2211.

The sidewall 2207 is etched selectively by using a solution including hydrofluoric acid and removed.

Next, the conductive protecting film 2202 is etched selectively by using the gate electrode 2203 as a mask. In this case, a conductive protecting film 2215 which is left being laminated with the gate electrode 2203 without being etched, is used as a gate electrode.

Further, a silicon oxide film is formed with a thickness 40 nm over the gate electrode 2203 to form an interlayer insulating film 2214, and then, subjected to a thermal activation. Contact holes are formed to draw wirings 2213, and then, hydrogenation is performed.

According to the above-described processes, an LDD region can be formed in a self-aligning manner and a TFT having an LDD structure in which damage by plasma is reduced can be formed. The manufacturing method of a semiconductor device according to the present invention as described above, is particularly effective in manufacturing a minute TFT having a structure in which a channel length is less than 2.0 μm. Further, the manufacturing method of the present invention is also effective in manufacturing a logic operation circuit or the like that is made by using such minute TFT.

Embodiment 1

Using the manufacturing method of a semiconductor device of the present invention successfully leads to an n-channel TFT and a p-channel TFT having an LDD structure allowing self-aligning LDD formation, and preventing damage by plasma as much as possible. Further, the manufacturing method of a semiconductor device of the present invention works effectively for manufacturing especially fine TFTs, and also works effectively for manufacturing logic operation circuits requiring fine TFTs faster in switching speed. In the present embodiment, referring to FIGS. 6A to 6C, 7A to 7C, 8A to 8C, 9A to 9C, 10A, and 10B, described, is a method for manufacturing, all on the same substrate, a logic operation circuit using TFTs of LDD structure manufactured according to manufacturing method of a semiconductor device of the present invention, pixel TFTs needed for manufacturing a liquid crystal display device or the like, and TFTs for a driver circuit. Using such a method favorably leads to a system-on-panel product, for example, carrying a display and peripheral circuit having a CPU (Central Processing Unit) incorporated therein together as a unit on the same substrate.

In the present embodiment, one substrate is provided with a TFT having an LDD structure for a logic operation circuit (hereinafter, simply referred to as logic operation circuit TFT), a TFT having an LDD structure for driving pixels of a liquid crystal display device (pixel TFT), and a TFT for a driver circuit of the liquid crystal display device (driver circuit TFT). The logic operation circuit TFT has the channel length of 1.0 μm and the LDD length of 0.5 μm, the pixel TFT has the channel length of 4.5 μm and the LDD length of 2.0 μm, and the driver circuit TFT has the channel length of 8.0 μm, the LDD length of 0.5 μm, and the Gate Overlapped LDD length of 2.0 μm.

After forming an amorphous silicon film 702 (not shown) to be 64 nm in thickness on a quartz substrate 701, nickel (Ni) being a metal element is added for catalyst to the side of the amorphous silicon film 702 formed. Such Ni addition is done by adding a solution including Ni to the amorphous silicon film 702 by spinning at room temperature.

Next, the amorphous silicon film 702 is subjected to a heat process at 600° C. for 12 hours to crystallize the same by solid-phase growth. As a result, a crystalline silicon film (not shown) is formed.

After forming a silicon oxide film on formed crystalline silicon film to be 50 nm in thickness, a gettering mask (not shown) is manufactured by going through a process. The gettering mask masks the region to be a TFT. Using the gettering mask 1002 as a mask, the crystalline silicon film is added with argon (Ar), and then, subjected to a heat process at 700° C. for 12 hours. In this manner, Ni is gettered into the region added with Ar. Then, using the gettering mask as a mask, the crystalline silicon film is removed from the region gettered with Ni, i.e., the region added with Ar through etching. As such, formed is a crystalline silicon film that has been completed with gettering.

Then, on the surface of the crystalline silicon film 1003, a thin oxide film of a few nm is formed through an UV ozone process (200° C. for 2 min). On thus formed oxide film, a silicon oxide film is formed to be 20 nm in thickness. Then, the crystalline silicon film is oxidized to be thinner by going through a heat process at 950° C. in an atmosphere of oxygen ($O_2$) including 3% hydrogen chloride (HCl). After oxidation, unneeded oxide film is removed by using a solution including a hydrofluoric acid. As to the crystalline silicon film, a heat process with high temperature for oxidation also effectively improves crystallinity.

For the purpose of controlling the threshold voltage of the TFT, the crystalline silicon film is added with boron in its entirety.

Further, by patterning and etching, the crystalline silicon film is processed to be a desired shape so as to form a semiconductor film 703 with element separated.

On formed semiconductor film 703, a silicon oxide film is formed with 40 nm thickness, thereby forming a gate oxide film 704.

Here, in order to form a Gate Overlapped LDD region of the n-channel TFT of the driver circuit TFT, addition of a low concentration of n-type impurity is made. All but the n-channel TFT for driver circuit are masked by pattering, and then, a part to be a channel region thereof is masked.

Then, the semiconductor film 703 is added with phosphorus of $1\times10^{18}$ atoms/cm$^3$, thereby forming a low-concentration n-type impurity region 705.

Next, to form a Gate Overlapped LDD region of the p-channel TFT of the driver circuit TFT, addition of a low concentration of p-type impurity is made. All but the p-channel TFT for driver circuit is masked by pattering, and then, a part to be a channel region thereof is masked. Then, the semiconductor film 703 is added with boron of $1\times10^{18}$ atoms/cm$^3$, thereby forming a low-concentration p-type impurity region 706.

Next formed is a gate electrode 707 first by forming a crystalline silicon film (n+poly-Si) that has been added with phosphorus to be 150 nm in thickness on the gate insulating film 704. Thereover, a tungsten silicide (WSix) film is formed to be 150 nm in thickness, and then, processed to be any desired shape by pattering and etching. Accordingly, formed gate electrode 707 has a structure in which two conductive films of n+poly-Si and Wsix are laminated together. Here, the gate electrode 707 may be a structure including a single conductive film, or two or more thereof, and may be made of any material as long as it has conductivity.

At this time, in the driver circuit TFT, the gate electrode 707 and the low-concentration n-type impurity region 705 (or low-concentration p-type impurity region 706) overlap one another in the region of about 2.0 μm in the channel length direction. The overlapping region will be a Gate Overlapped LDD region 2002 for the n-channel TFT for driver circuit, and a Gate Overlapped LDD region 2004 for the p-channel TFT for driver circuit.

Next formed is a low-concentration n-type impurity region 708 by masking the driver circuit TFT and the p-channel TFT for logic operation circuit by using a resist, and by adding a low concentration of n-type impurity to the semiconductor films 703 of the n-channel TFT for logic operation circuit and the pixel TFT while using the gate electrode 707 as a mask. In this embodiment, the n-type impurity is phosphorus with the concentration of $1\times10^{17}$ atoms/cm$^3$.

A low-concentration p-type impurity region 709 is then formed by masking the driver circuit TFT, the pixel TFT, and the n-channel TFT for logic operation circuit by using a resist, and by adding a low concentration of p-type impurity to the semiconductor film 703 of the p-channel TFT for logic operation circuit while using the gate electrode 707 as a mask. In this embodiment, the p-type impurity is boron with the concentration of $1\times10^{17}$ atoms/cm$^3$.

On the gate electrode 707, a silicon oxide film is formed with 40 nm thickness in such a manner as to cover the substrate in its entirety, thereby forming an insulative protecting film 710. On the insulative protecting film 710, formed is an n+poly-Si film of 50 nm, forming a conductive protecting film 711.

Then, on the conductive protecting film 711, formed is a silicon oxide film of 40 nm having better step coverage even if the object is uneven, forming a sidewall film 712. A sidewall 713 is then formed by selectively applying the sidewall film 712 to a process of anisotropic etching mainly in the vertical direction.

Next, an n-type source and drain regions 714 are formed first by masking, using a resist, all but the regions to be source and drain regions of the p-type channel TFT for driver circuit, the p-channel TFT for logic operation circuit, and the pixel TFT and adding a high concentration of n-type impurity to the semiconductor films 703 of the n-channel TFT for logic operation circuit, the pixel TFT, and the n-channel TFT for driver circuit while using the gate electrode 707, the sidewall 713, the insulative protecting film 710, and the conductive protecting film 711 as masks. In this embodiment, used for addition is phosphorus of $1\times10^{20}$ atoms/cm$^3$. At this time, LDD regions 2001 are formed simultaneously. Herein, in the pixel TFT, the area of 2.0 μm from the side surface of the gate electrode 707 is masked to form an LDD region of 2.0 μm.

Then, a p-type source and drain regions 715 are formed first by masking, using a resist, all but the regions to be the n-type channel TFT for driver circuit, the n-channel TFT for logic operation circuit, and the pixel TFT and adding a high concentration of p-type impurity to the semiconductor films 703 of the p-channel TFT for logic operation circuit, and the p-channel TFT for driver circuit while using the gate electrode 707, the sidewall 713, the insulative protecting film 710, and the conductive protecting film 711 as masks. In this embodiment, used for addition is boron of $1\times10^{20}$ atoms/cm$^3$. At this time, LDD regions 2003 and 2006 are formed simultaneously.

As such, in the present embodiment, the Gate Overlapped LDD region of the driver circuit TFT and the LDD region of the pixel TFT are not formed in a self-aligning manner but formed by pattering. This causes no problem because their size is rather larger, i.e., 2.0 μm, than the alignment accuracy for pattering, i.e., about ±0.2 μm. What is better, LDD formation as such can be done easier than forming sidewall through forming and etching a silicon oxide film of about 2.0 μm. As such, depending on the required size, an LDD region can be formed as appropriate by either self-aligning or pattering method. Further, in this embodiment, the Gate Overlapped LDD region of the driver circuit TFT and the LDD region of the pixel TFT are both 2.0 μm in size. This size is not surely restrictive, and may be adjusted in such a manner as to obtain the TFT characteristics and TFT reliability needed by operators. Similarly, the driver circuit TFT is provided with both the Gate Overlapped LDD region and the LDD region. This structure is selected specifically for the TFT with larger element size and higher driving voltage, i.e., driver circuit TFT, for the reason that it favorably achieves better reliability with respect to hot carrier degradation. However, such a structure is not surely restrictive.

Further, the LDD length is the total thickness of the insulative protecting film 710, the conductive protecting film 711, and the sidewall film 712. In the present embodiment, because the insulative protecting film 710 of 40 nm, the conductive protecting film 711 of 50 nm, and the sidewall film 712 of 400 nm are laminated together, the LDD region is formed in a self-aligning manner with a thickness of about 0.5 m. It should be noted here that, the LDD length is not necessarily 0.5 m, and may be determined as appropriate by the operators to obtain desired TFT characteristics or reliability. Similarly, the insulative protecting film 710, the conductive protecting film 711, and the sidewall film 712 are not restrictive to the above film thickness, and the operators may determine thickness they consider as appropriate.

Next, the sidewall 713 is removed under the room temperature using a solution including a hydrofluoric acid. Then, the conductive protecting film 711 is removed using a TMAH solution with the temperature of about 45° C. The insulative protecting film 710 is not removed, and used as a part of the interlayer insulating film.

Next formed is a silicon oxide film of 40 nm on the insulative protecting film 710. Thereon, an interlayer insulating film 716 is then formed, and subjected to a heat process for activation at 950° C. for 30 minutes.

On thus formed interlayer insulating film 716, a silicon nitride-oxide film is formed with 900 nm so as to form an interlayer insulating film 717.

Next, contact holes are formed by patterning and etching, and thereonto, titanium (Ti), titanium nitride (TiN), aluminum (Al), and titanium (Ti) are laminated together in order to install wiring 718 by patterning and etching. After forming an ITO (Indium Tin Oxide), a pixel electrode 719 is formed through a processing by patterning and etching. In the present embodiment, a region in which the wiring 718 and the pixel electrode 719 are laminated is provided so as to establish a direct electric connection without via the contact holes.

By going through the above processes, the logic operation circuit TFT, the pixel TFT, and the driver circuit TFT are formed on the same substrate. In this embodiment, the p-channel TFT for logic operation circuit is formed of LDD formation, but this is not surely restrictive. Compared with the n-channel TFT, the p-channel TFT being low in electron mobility, in some cases, even in a single drain structure, can prevent degradation due to hot carrier by increasing the channel length.

Although no description is made in this embodiment, process such as washing or heat process may be applied as required. Also, the interlayer insulating film and the wiring may be repeatedly formed so as to realize multi-layer wiring structure. As the interlayer insulating film, a silicon oxide film may be formed by coating to make the uneven surface flat.

In this embodiment, quartz is used for the substrate for TFT formation. Alternatively, a material such as glass or plastic can be used. In this case, the requirements for a heat process or film formation need to be changed as appropriate to realize every process under the temperature requirements with which the substrate material is resistant.

Embodiment 2

Figure 11:
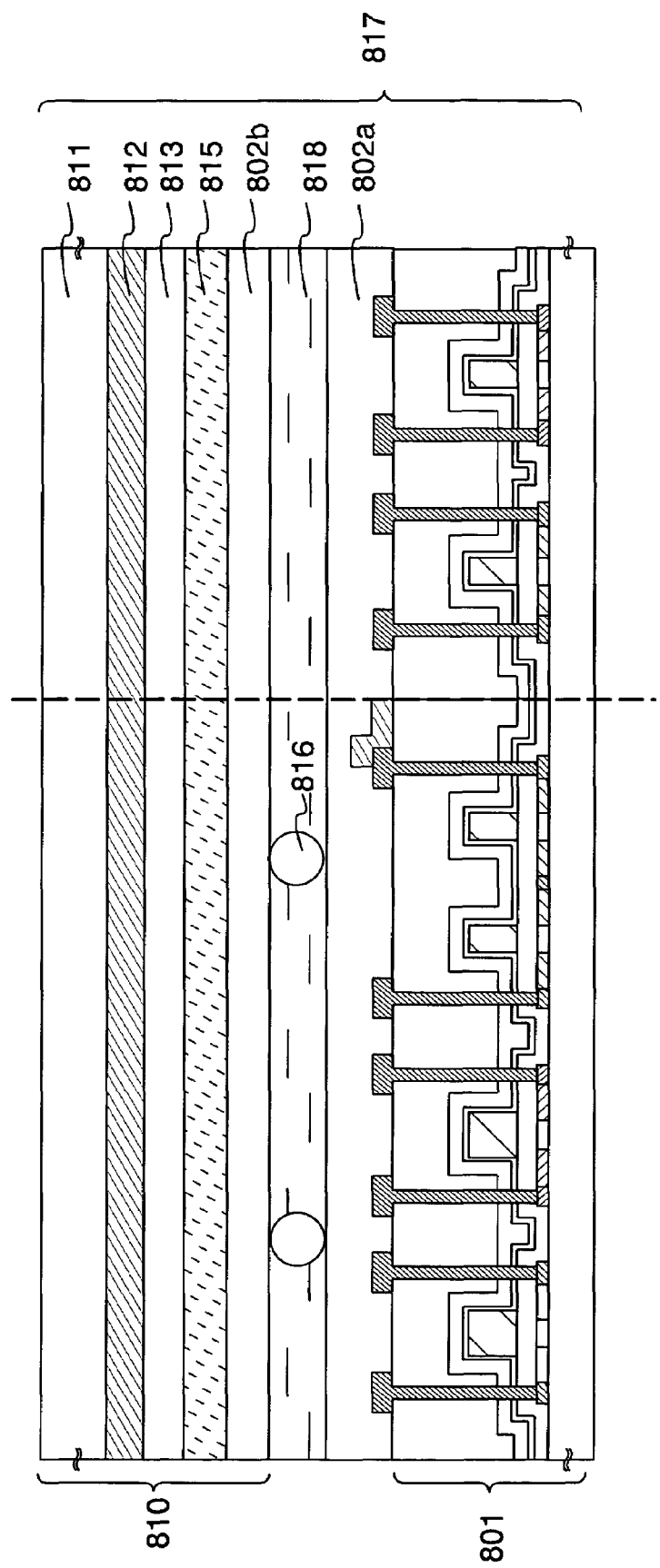
FIG. 11 is a cross-sectional view showing a part of a liquid crystal display device.

By using a TFT array substrate made by the method shown in Embodiment 1, it is possible to manufacture a liquid crystal display in which a peripheral circuit having a CPU (Central Processing Unit) and a display are built on one substrate. Therefore, a liquid crystal display having multi-function is downsized. Hereinafter, a description is made with reference to FIG. 11 and FIG. 12.

An oriented film 802a is formed in the side of a TFT of a TFT array substrate 801 manufactured according to Embodiment Mode 1. The oriented film 802a is formed by offset printing method. Polyimide resin is used as a material of the oriented film 802a. Instead of using polyimide resin, polyamide resin may be used. Then, the oriented film 802a is subjected to a rubbing treatment so that liquid crystal molecules are oriented with a certain pre-tilt angle.

Subsequently, an opposite substrate 810 is formed. A light shielding film 812 is formed over a substrate 811. The light shielding film 812 is formed by using chromium metal and subjected to photolithography or etching. A pixel electrode 813 is formed over the light shielding film 812. The pixel electrode is made of a transparent conductive film, namely, ITO and subjected to photolithography and etching. When a color filter (not shown) is provided between the light shielding film 812 and a pixel electrode 813, colored resin having a desired color is applied by spin coating method, and then exposed to light and developed. The above-described color filter formation process is repeated to provide each of color filters of R, G, and B. A passivation film 815 for planarization is formed in order to fill a step between the color filter 814 and the light shielding film 812. The passivation film 815 is formed by applying acrylic resin on the color filters. Materials that are useful for planarization may be used, instead of acrylic resin. When color filters are not provided, the passivation film 815 is not always required.

Over the formed opposite substrate, an oriented film 802b is formed. The oriented film 802b is formed over the opposite substrate by the same offset printing method as over the TFT array substrate 801. Polyimide resin is used as a material of the oriented film 802b. Instead of using polyimide resin, polyamide resin may be used. Then, the oriented film 802b is subjected to a rubbing treatment so that liquid crystal molecules are oriented with a certain pre-tilt angle. A sealing agent (not shown) is applied in the side of the opposite substrate to bond the opposite substrate and the TFT array substrate, and then the opposite substrate 810 is heated in an oven to temporarily cure the sealing agent. Thereafter, a spacer 816 of plastic sphere is sprayed in the side of the pixel electrode on the opposite substrate.

The TFT array substrate 801 and the opposite substrate 810 are bonded to each other with accuracy to manufacture a liquid crystal panel 817 in a manner that the side of the TFT of the TFT array substrate faces the side of the pixel electrode of the opposite substrate 810. Filler is mixed into the sealing agent, and thus, it is possible to bond the two substrates at an even interval by the filler and the spacer.

Unnecessary portion of the bonded substrates is cut off to form the liquid crystal panel 817 having a desired shape. A liquid crystal material 818 is injected into the inside of the liquid crystal panel 817. After the whole inside of the panel is filled with the liquid crystal material 818, the panel is completely sealed by using the sealing agent (not shown).

Figure 12:
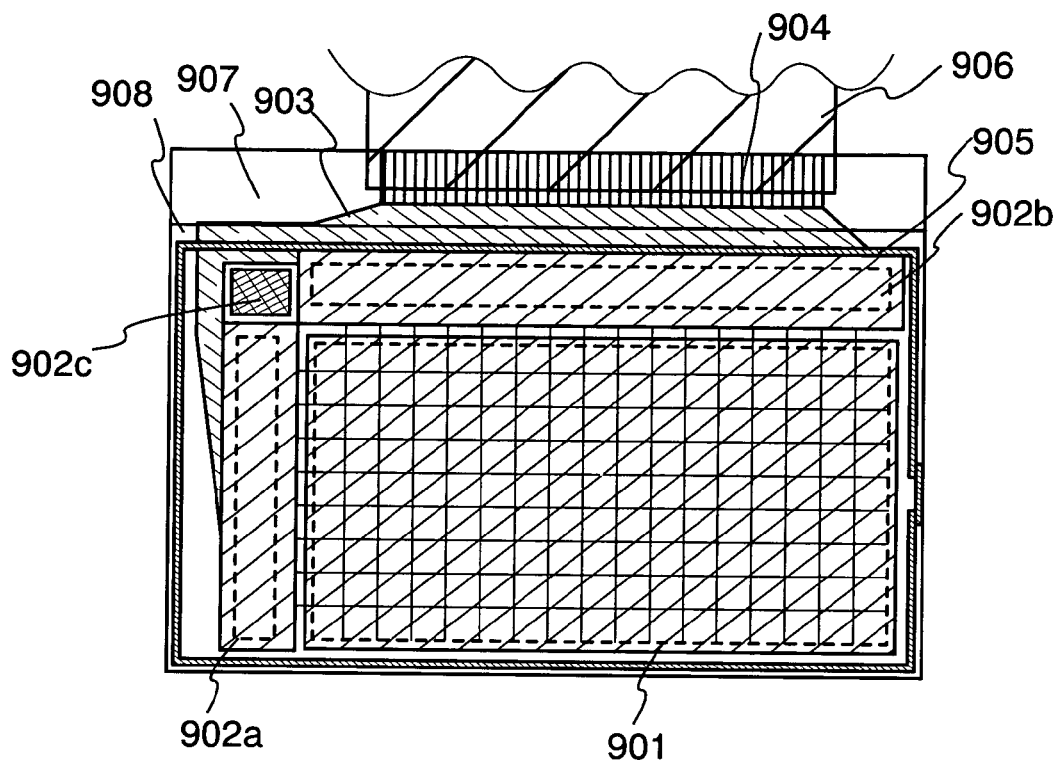
FIG. 12 is a top view showing an entire liquid crystal display device.

FIG. 12 shows a top view of the liquid crystal panel 817. A scanning signal driver circuit 902a and a video signal driver circuit 902b are provided in the periphery of a pixel portion 901. A logic operation circuit 902c such as a CPU or a memory is provided. The driver circuits are connected to an external input-output terminal portion 904 through connecting wirings group 903. In the pixel portion 901, gate wirings group extended from the scanning signal driver circuit 902a and data wirings group from the video signal driver circuit 902b are crossed in a matrix to form a pixel. A pixel TFT, a storage capacitor and a pixel electrode are provided for each of the pixels. A sealing agent 905 is formed between the outer side of the pixel portion 901 and the scanning signal driver circuit 902a and the video signal driver circuit 902b and a logic operation circuit 902c of the TFT array substrate 908 and the inner side of the external input-output terminal portion 904. In the outside of the liquid crystal panel 817, a flexible printed circuit 909 is connected to the external input-output terminal portion 904 and also to each driver circuit via the connecting wirings group 903. The external input-output terminal portion 904 is formed of the same conductive film as the data wirings. In the flexible printed circuit 906, copper wirings are formed in an organic resin film such as polyimide and connected to the external input-output terminal portion 904 by using an anisotropic conductive adhesive.

A polarization plate and a retardation film are provided in the side of the opposite substrate of the liquid crystal panel 817 so that a straight polarized light in the same direction as a director direction of liquid crystal molecules in a liquid crystal layer that is closest to the opposite substrate can be incident into. Further, a polarization plate and a retardation film are provided in the side of the TFT substrate of the liquid crystal panel 817 so that a light in the same direction as a director direction of liquid crystal molecules in a liquid crystal layer that is closest to the TFT substrate can be incident into.

By the above-mentioned method, a periphery circuit in which a central processing unit (CPU) is incorporated and a display are integrated in the one substrate to form a liquid crystal display. A cleaning process and a heat treatment process may be performed as necessary, although not described in this Embodiment.

Embodiment 3

According to the manufacturing method of a semiconductor device of the present invention, a system-on-panel in which a display screen (a display) and a periphery circuit in which a central processing unit (CPU) is incorporated are integrated can be formed. This makes it possible to shorten processes for manufacturing a display or inspection process, and thus, cost is reduced. Further, a display having multifunction can be downsized.

Figure 13:
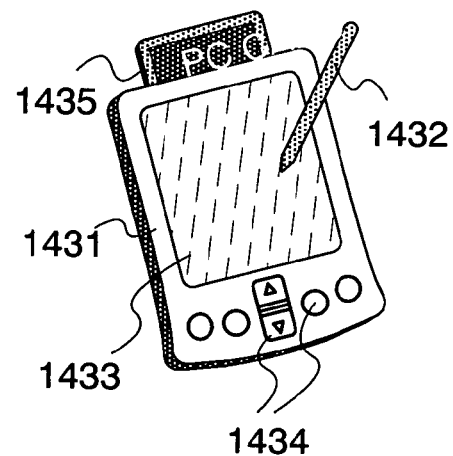
FIG. 13 shows an example of electric appliances equipped with a liquid crystal display device made by the manufacturing method of a semiconductor device according to the present invention.
Figure 15A:
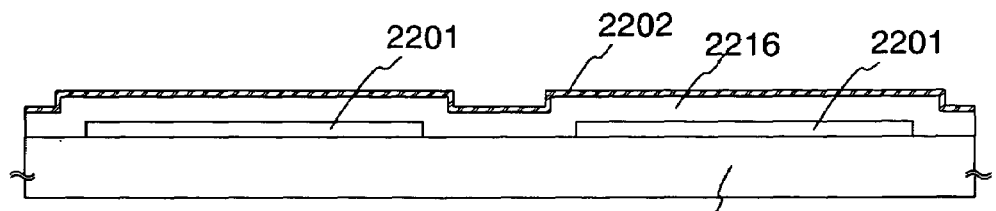
FIGS. 15A to 15E are cross-sectional views showing a manufacturing process of a TFT having a LDD structure according to the present invention.
Figure 15B:
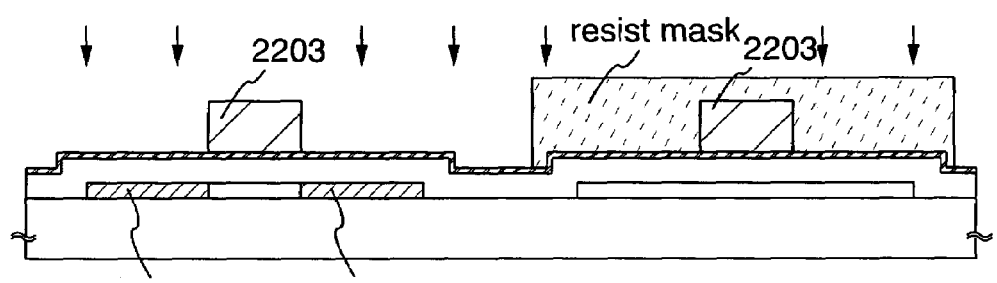
Figure 15C:
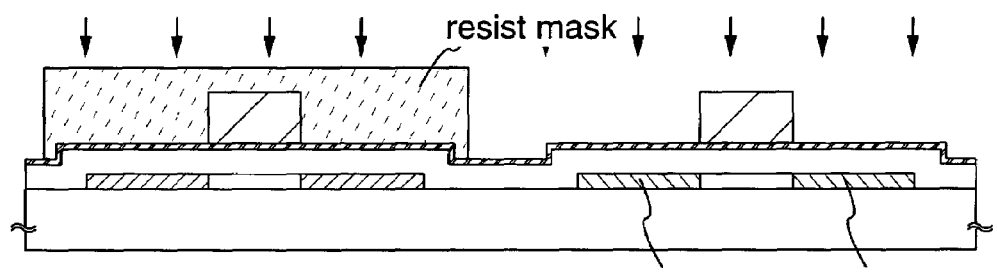
Figure 15D:
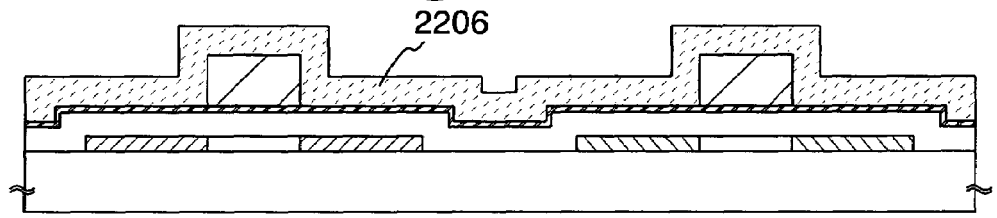
Figure 15E:
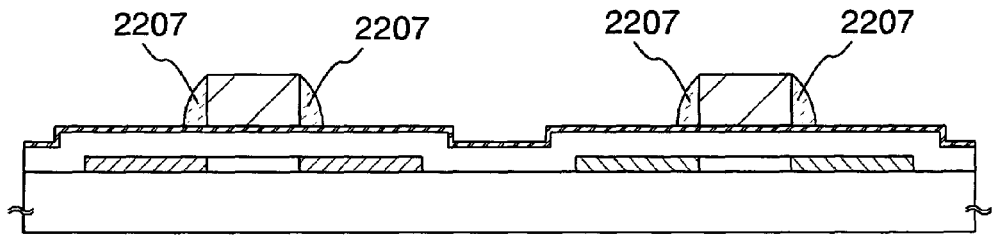
Figure 16A:
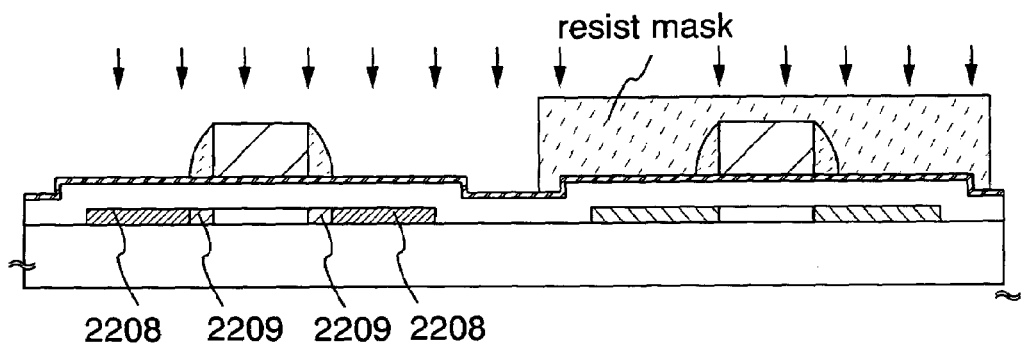
FIGS. 16A to 16E are cross-sectional views showing a manufacturing process of a TFT having a LDD structure according to the present invention.
Figure 16B:
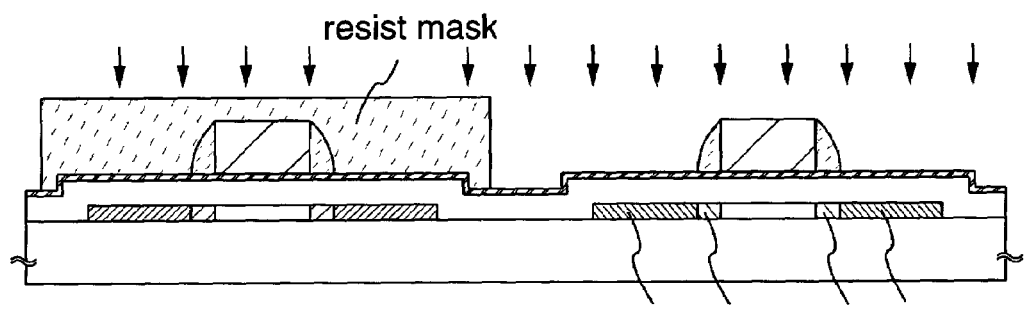
Figure 16C:
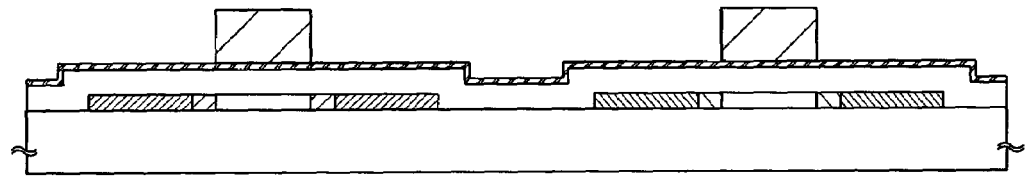
Figure 16D:
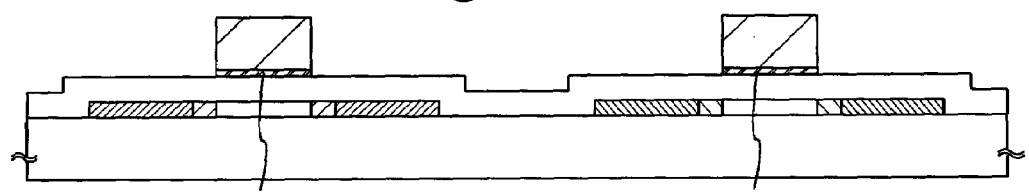
Figure 16E:
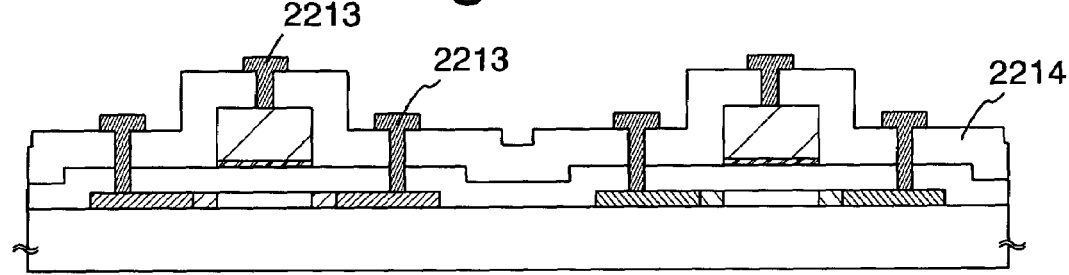

FIG. 13 shows an example of electric appliances equipped with a system-on-panel by the manufacturing method of a semiconductor device according to the present invention.

FIG. 13 shows a portable information terminal. A system-on-panel (display portion) 1433, an external interface 1435, operation switches 1434, and the like are provided for a main body 1431. As an attachment for the operation, a stylus pen 1432 may be used. In this manner, by mounting the system-on-panel 1433 on the portable information terminal, it is possible that information-processing capabilities have multifunction, maintaining its downsized body.

Embodiment 4

A manufacturing method of a semiconductor device according to the present invention can be applied to a manufacturing process of a MOS transistor which is fabricated by using a silicon wafer of a bulk or a SOI wafer, in addition to a manufacturing process of a TFT. A description about this case is given hereinafter.

A gate insulating film is formed over a silicon wafer of a bulk that is element-separated by LOCOS (Local Oxidation of Silicon), STI (Shallow Trench Isolation) or the like.

After forming the gate insulating film, a gate electrode, an LDD region, a source and a drain regions, an interlayer insulating film, wirings and the like are formed to form a MOS transistor according to the process after forming the gate insulating film 403 or the gate insulating film 2216 in Embodiment Mode 1 or 2.

Note that heat treatment condition or the like is not limited to the conditions in Embodiment Mode 1 or 2, and can be changed as necessary.

According to a manufacturing method of the present invention, a semiconductor device having an LDD structure can be manufactured in a self-aligning manner by the means of preventing the degradation due to plasma. Such a manufacturing method is required in case of manufacturing miniaturized TFTs, which is damaged more from plasma or doping since the surface area of gate electrodes become smaller. Also, the manufacturing method of a semiconductor device according to the present invention is applied to a MOS transistor or an LSI formed by using MOS transistor as well as a TFT.

What is claimed is:

1. A semiconductor device manufacturing method, comprising the steps of:
    forming a semiconductor film over an insulating surface;
    forming a gate insulating film on the semiconductor film;
    forming a gate electrode on the gate insulating film;

adding a first impurity to the semiconductor film while using the gate electrode as a mask;
forming a conductive film over the gate insulating film and the gate electrode;
forming a sidewall to a side surface of the gate electrode in a condition of the gate insulating film and the gate electrode being covered by the conductive film; and
adding a second impurity to the semiconductor film while using the gate electrode and the sidewall as masks through the conductive film and the gate insulating film.

2. The semiconductor device manufacturing method according to claim 1, wherein the semiconductor device has a channel forming region with a channel length of 2.0 µm or shorter.

3. The semiconductor device manufacturing method according to claim 1, wherein the semiconductor device incorporates a logic circuit.

4. A semiconductor device manufacturing method, comprising the steps of:
forming a semiconductor film over an insulating surface;
forming a gate insulating film on the semiconductor film;
forming a gate electrode on the gate insulating film;
adding a first impurity to the semiconductor film while using the gate electrode as a mask;
forming an insulating film over the gate insulating film and the gate electrode;
forming a conductive film over the insulating film;
forming a sidewall to a side surface of the gate electrode in a condition of the insulating film being covered by the conductive film; and
adding a second impurity to the semiconductor film while using the gate electrode and the sidewall as masks through the conductive film, the insulating film and the gate insulating film.

5. The semiconductor device manufacturing method according to claim 4, wherein the semiconductor device has a channel forming region with a channel length of 2.0 µm or shorter.

6. The semiconductor device manufacturing method according to claim 4, wherein the semiconductor device incorporates a logic circuit.

7. A semiconductor device manufacturing method, comprising the steps of:
forming a semiconductor film over an insulating surface;
forming a gate insulating film on the semiconductor film;
forming a gate electrode on the gate insulating film;
adding a first impurity to the semiconductor film while using the gate electrode as a mask;
forming a conductive film over the gate insulating film and the gate electrode;
forming a sidewall to a side surface of the gate electrode in a condition of the gate insulating film and the gate electrode being covered by the conductive film;
adding a second impurity to the semiconductor film while using the gate electrode and the sidewall as masks;
removing the sidewall; and
removing the conductive film after removing the sidewall.

8. The semiconductor device manufacturing method according to claim 7, wherein the semiconductor device has a channel forming region with a channel length of 2.0 µm or shorter.

9. The semiconductor device manufacturing method according to claim 7, wherein the second impurity is added through the conductive film and the gate insulating film.

10. The semiconductor device manufacturing method according to claim 7, wherein the semiconductor device incorporates a logic circuit.

11. A semiconductor device manufacturing method, comprising the steps of:
forming a semiconductor film over an insulating surface;
forming a gate insulating film on the semiconductor film;
forming a gate electrode on the gate insulating film;
adding a first impurity to the semiconductor film while using the gate electrode as a mask;
forming an insulating film covering the gate insulating film and the gate electrode;
forming a conductive film over the insulating film;
forming a sidewall to a side surface of the gate electrode in a condition of the insulating film being covered by the conductive film;
adding a second impurity to the semiconductor film while using the gate electrode and the sidewall as masks;
removing the sidewall; and
removing the conductive film after removing the sidewall.

12. The semiconductor device manufacturing method according to claim 11, wherein the semiconductor device has a channel forming region with a channel length of 2.0 µm or shorter.

13. The semiconductor device manufacturing method according to claim 11, wherein the second impurity is added through the conductive film, the insulating film and the gate insulating film.

14. The semiconductor device manufacturing method according to claim 11, wherein the semiconductor device incorporates a logic circuit.

15. A semiconductor device manufacturing method, comprising the steps of:
forming a semiconductor film over a substrate;
forming a gate insulating film on the semiconductor film;
forming a conductive film on the gate insulating film;
forming a gate electrode on the conductive film;
adding a first impurity to the semiconductor film while using the gate electrode as a mask;
forming a sidewall to a side surface of the gate electrode in a condition of the gate insulating film being covered by the conductive film; and
adding a second impurity to the semiconductor film while using the gate electrode and the sidewall as masks through the conductive film and the gate insulating film.

16. The semiconductor device manufacturing method according to claim 15, wherein the semiconductor device has a channel forming region with a channel length of 2.0 µm or shorter.

17. The semiconductor device manufacturing method according to claim 15, wherein the first impurity is added through the conductive film and the gate insulating film.

18. The semiconductor device manufacturing method according to claim 15, wherein the semiconductor device incorporates a logic circuit.

19. A semiconductor device manufacturing method, comprising the steps of:
forming a semiconductor film over a substrate;
forming a gate insulating film on the semiconductor film;
forming a conductive film on the gate insulating film;
forming a gate electrode on the conductive film;
adding a first impurity to the semiconductor film while using the gate electrode as a first mask;
forming a sidewall over the conductive film to a side surface of the gate electrode, the gate insulating film being covered by the conductive film;

adding a second impurity to the semiconductor film while using the gate electrode and the sidewall as masks;

removing the sidewall; and processing the conductive film while using the gate electrode as a second mask.

20. The semiconductor device manufacturing method according to claim 19, wherein the semiconductor device has a channel forming region with a channel length of 2.0 µm or shorter.

21. The semiconductor device manufacturing method according to claim 19, wherein the first impurity is added through the conductive film and the gate insulating film.

22. The semiconductor device manufacturing method according to claim 19, wherein the second impurity is added through the conductive film and the gate insulating film.

23. The semiconductor device manufacturing method according to claim 19, wherein the semiconductor device incorporates a logic circuit.

24. A semiconductor device manufacturing method, comprising the steps of:

forming a semiconductor film over an insulating surface;

forming a gate insulating film on the semiconductor film;

forming a gate electrode on the gate insulating film;

adding a first impurity to the semiconductor film while using the gate electrode as a mask;

forming a conductive film over the gate insulating film and the gate electrode;

forming a sidewall having insulating property to a side surface of the gate electrode in a condition of the gate insulating film and the gate electrode being covered by the conductive film;

adding a second impurity to the semiconductor film while using the gate electrode and the sidewall as masks;

removing the sidewall; and removing the conductive film.

25. The semiconductor device manufacturing method according to claim 24, wherein the conductive film is removed after removing the sidewall.

26. A semiconductor device manufacturing method, comprising the steps of:

forming a semiconductor film over an insulating surface;

forming a gate insulating film on the semiconductor film;

forming a gate electrode on the gate insulating film;

adding a first impurity to the semiconductor film while using the gate electrode as a mask;

forming an insulating film covering the gate insulating film and the gate electrode;

forming a conductive film over the insulating film;

forming a sidewall having insulating property to a side surface of the gate electrode in a condition of the insulating film being covered by the conductive film;

adding a second impurity to the semiconductor film while using the gate electrode and the sidewall as masks;

removing the sidewall; and removing the conductive film.

27. The semiconductor device manufacturing method according to claim 26, wherein the conductive film is removed after removing the sidewall.

* * * * *